(12) United States Patent
Park et al.

(10) Patent No.: US 9,780,127 B2
(45) Date of Patent: Oct. 3, 2017

(54) LIQUID CRYSTAL DISPLAY AND MANUFACTURING METHOD THEREOF

(71) Applicant: Samsung Display Co., Ltd., Yongin, Gyeonggi-Do (KR)

(72) Inventors: Je Hyeong Park, Hwaseong-si (KR); Eun-Kil Park, Cheonan-si (KR); Seung Ho Yang, Hwaseong-si (KR); Chang Il Tae, Seoul (KR)

(73) Assignee: Samsung Display Co., Ltd. (KR)

( * ) Notice: Subject to any disclaimer, the term of this patent is extended or adjusted under 35 U.S.C. 154(b) by 391 days.

(21) Appl. No.: 14/567,638

(22) Filed: Dec. 11, 2014

(65) Prior Publication Data
US 2016/0033835 A1    Feb. 4, 2016

(30) Foreign Application Priority Data
Jul. 29, 2014  (KR) .......................... 10-2014-0096608

(51) Int. Cl.
| | |
|---|---|
| *G02F 1/1341* | (2006.01) |
| *H01L 27/12* | (2006.01) |
| *G02F 1/1333* | (2006.01) |
| G02F 1/1335 | (2006.01) |
| G02F 1/1362 | (2006.01) |
| G02F 1/1343 | (2006.01) |

(52) U.S. Cl.
CPC .... *H01L 27/1259* (2013.01); *G02F 1/133377* (2013.01); *G02F 1/1341* (2013.01); *G02F 1/133514* (2013.01); *G02F 2001/134345* (2013.01); *G02F 2001/136218* (2013.01)

(58) Field of Classification Search
CPC .......... G02F 1/133377; G02F 1/13394; G02F 2001/136218; G02F 2001/134345
See application file for complete search history.

(56) References Cited

U.S. PATENT DOCUMENTS

2014/0117385 A1    5/2014 Park et al.

FOREIGN PATENT DOCUMENTS

| KR | 1019990088186 A | 12/1999 |
|---|---|---|
| KR | 1020120026880 A | 3/2012 |
| KR | 1020140021749 A | 2/2014 |

*Primary Examiner* — Thanh-Nhan P Nguyen
(74) *Attorney, Agent, or Firm* — Innovation Counsel LLP

(57) ABSTRACT

A liquid crystal display includes: an insulation substrate; a thin film transistor including gate and data lines on the insulation substrate; a passivation layer on the thin film transistor; a pixel electrode on the passivation layer and including a first subpixel electrode to which a first voltage is applied and a second subpixel electrode to which a second voltage is applied; a shielding electrode on the passivation layer and applied with a common voltage; a first microcavity on the pixel electrode and injected with a liquid crystal material; a second microcavity on the shielding electrode and injected with the liquid crystal material; a common electrode on the first and second microcavities and separated from the pixel electrode and the shielding electrode by the first and second microcavities; a roof layer on the common electrode;; and an overcoat on the roof layer to seal the first and second microcavities.

16 Claims, 22 Drawing Sheets

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2014-0096608 filed in the Korean Intellectual Property Office on Jul. 29, 2014, the entire contents of which are incorporated herein by reference.

BACKGROUND (a) Field

The present application relates to a liquid crystal display and a manufacturing method thereof.

(b) Description of the Related Art

Display devices are required for computer monitors, televisions, mobile phones, and the like which are widely used these days.

The display devices include a cathode ray tube (CRT) display, a liquid crystal display (LCD), a plasma display panel (PDP), and the like.

As one of the most widely used flat panel displays at present, a liquid crystal display (LCD) includes two display panels on which field generating electrodes such as a pixel electrode and a common electrode are formed, and a liquid crystal layer interposed between the two display panels. The LCD displays an image by generating an electric field on a liquid crystal layer by applying a voltage to the field generating electrodes, determining alignment directions of liquid crystal molecules of the liquid crystal layer by the generated field, and controlling polarization of incident light.

Two sheets of display panels of which the LCD consists may include a thin film transistor array panel and an opposing display panel.

In the thin film transistor array panel, a gate line for transmitting a gate signal and a data line for transmitting a data signal are formed to cross each other, and a thin film transistor coupled to the gate and data lines, a pixel electrode coupled to the thin film transistor, and the like may be formed.

In the opposing display panel, a light blocking member, a color filter, a common electrode, and the like may be formed.

In some embodiments, the light blocking member, the color filter, and the common electrode may be formed on the thin film transistor array panel.

However, in conventional LCDs, two substrates are required and constituent elements are respectively formed on the two substrates, thereby requiring a long processing time as well as making the display device heavy, thick, and costly. The above information disclosed in this Background section is only for enhancement of understanding of the background and therefore it may contain information that does not form the prior art that is already known in this country to a person of ordinary skill in the art.

SUMMARY

Embodiments have been made in an effort to provide a display device and a manufacturing method thereof that can reduce a thickness, a width, a cost, and a processing time by manufacturing the display device using one substrate.

In addition, embodiments have been made in an effort to provide a display device and a manufacturing method thereof for allowing light leakage to be controlled as well as improving side visibility.

A liquid crystal display (LCD) according to an exemplary embodiment includes: an insulation substrate including a plurality of pixel areas; a thin film transistor including gate and data lines positioned on the insulation substrate and that are insulated from and cross each other; a passivation layer positioned on the thin film transistor; a pixel electrode positioned on the passivation layer and including a first subpixel electrode to which a first voltage is configured to be applied and a second subpixel electrode to which a second voltage is configured to be applied; a shielding electrode positioned on the passivation layer and configured to be applied with a common voltage; a first microcavity positioned on the pixel electrode and injected with a liquid crystal material; a second microcavity positioned on the shielding electrode and injected with the liquid crystal material; a common electrode positioned on the first and second microcavities and separated from the pixel electrode and the shielding electrode by the first and second microcavities; a roof layer positioned on the common electrode; a first injection hole and a second injection hole in the common electrode and the roof layer to extend to the first and second microcavities; and an overcoat positioned on the roof layer and covering the first and second injection holes to seal the first and second microcavities.

The shielding electrode may overlap the data line.

The LCD may further include: a color filter positioned on the passivation layer; a first insulating layer positioned on the color filter; a second insulating layer positioned between the first and second subpixel electrodes; and a third insulating layer positioned on the common electrode.

The LCD may further include a light blocking member positioned on the second insulating layer along a direction of the gate line.

At least a part of the first subpixel electrode may be positioned under the second insulating layer, an other part of the first subpixel electrode may be positioned on the second insulating layer, and the second subpixel electrode may be positioned on the second insulating layer.

The first subpixel electrode may include a first subregion positioned under the second insulating layer and a second subregion positioned over the second insulating layer, and the first subregion and the second subregion may be coupled to each other through a contact hole that is in the second insulating layer.

The second subpixel electrode may include a plurality of branch electrodes that extend along respective different directions.

One pixel area may include: a first region where the second subregion of the first subpixel electrode is positioned; a second region where the first subregion of the first subpixel electrode and a part of the second subpixel electrode overlap each other; and a third region where an other part of the second subpixel electrode is positioned.

A difference between the first voltage and the common voltage may be greater than a difference between the second voltage and the common voltage.

A liquid crystal display (LCD) according to another exemplary embodiment includes: an insulation substrate including a plurality of pixel areas; a thin film transistor including gate and data lines positioned on the insulation substrate and that are insulated from and cross each other; a passivation layer positioned on the thin film transistor; a pixel electrode positioned on the passivation layer and including a first subpixel electrode to which a first voltage is configured to be applied and a second subpixel electrode to which a second voltage is configured to be applied; a shielding electrode positioned on the passivation layer and configured to be applied with a common voltage; a microcavity positioned on the pixel and shielding electrodes and injected with a liquid crystal material to form a liquid crystal layer; a common electrode positioned on the microcavity and separated from the pixel electrode by the liquid crystal layer; a roof layer positioned on the common electrode; an injection hole in the common electrode and the roof layer to extend to the microcavity; and an overcoat positioned on the roof layer and covering the injection hole to seal the microcavity. The microcavity overlaps the shielding electrode and the pixel electrode.

The LCD may further include: a color filter positioned on the passivation layer; a first insulating layer positioned on the color filter; a second insulating layer positioned between the first and second subpixel electrodes; and a third insulating layer positioned on the common electrode.

The shielding electrode may further include a light blocking member overlapping the data line, positioned on the second insulating layer, and disposed along a direction of the gate line.

At least a part of the first subpixel electrode may be positioned under the second insulating layer, and the second subpixel electrode may be positioned over the second insulating layer.

The first subpixel electrode may include a first subregion positioned under the second insulating layer and a second subregion positioned over the second insulating layer, and the first and second subregions may be coupled to each other through a contact hole in the second insulating layer.

The second subpixel electrode may include a plurality of branch electrodes that extend along respective different directions.

One pixel area may include: a first region where the second subregion of the first subpixel electrode is positioned; a second region where the first subregion of the first subpixel electrode and a part of the second subpixel electrode overlap each other; and a third region where an other part of the second subpixel electrode is positioned. A difference between the first voltage and the common voltage may be greater than a difference between the second voltage and the common voltage.

A manufacturing method of a liquid crystal display (LCD) according to an exemplary embodiment includes: forming a thin film transistor on a substrate; forming a passivation layer on the thin film transistor; forming a first subpixel electrode and a second subpixel electrode on the passivation layer that are coupled to the thin film transistor; simultaneously forming a shielding electrode with the first subpixel electrode; forming a sacrificial layer on the first subpixel electrode, the second subpixel electrode, and the shielding electrode; forming a common electrode on the sacrificial layer; forming a roof layer by coating and then patterning an organic material on the common electrode; exposing the sacrificial layer; forming a microcavity between the pixel electrode and the common electrode by removing the exposed sacrificial layer; forming a liquid crystal layer by injecting a liquid crystal material into the microcavity; and sealing the microcavity by forming an overcoat on the roof layer.

The manufacturing method may further include: forming a color filter on the thin film transistor; forming a first insulating layer on the color filter; forming a second insulating layer between a part of the first subpixel electrode and the second subpixel electrode; and forming a light blocking member on the second insulating layer.

The microcavity may be formed to overlap the shielding electrode.

The microcavity may include a first microcavity and a second microcavity that are separated from each other, the first microcavity may be formed to overlap the pixel electrode, and the second microcavity may be formed to overlap the shielding electrode.

As described above, the LCD and the manufacturing method thereof according to the exemplary embodiments can reduce a thickness, a width, a cost, and a processing time by manufacturing the display device using one substrate.

In addition, the side visibility can improved using a pixel structure split into three regions, and the light leakage can be controlled by the shielding electrode and the horizontal light blocking member.

DETAILED DESCRIPTION OF THE EMBODIMENTS

Figure 1:
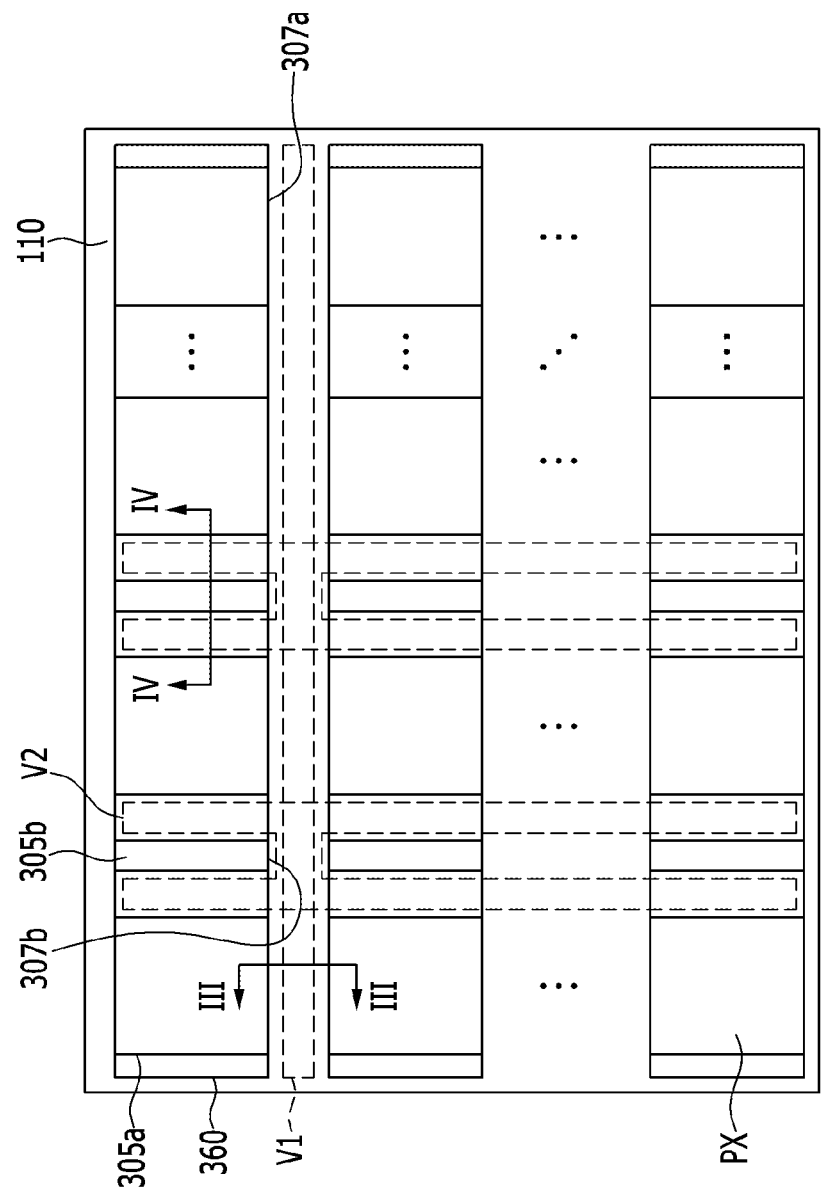
FIG. 1 is a top plan view of a display device according to an exemplary embodiment.

The inventive concept will be described more fully hereinafter with reference to the accompanying drawings, in which exemplary embodiments are shown.

As those skilled in the art would realize, the described embodiments may be modified in various different ways, all without departing from the spirit or scope of the inventive concept.

In the drawings, the thickness of layers, films, panels, regions, etc. are exaggerated for clarity.

Like reference numerals designate like elements throughout the specification. It will be understood that when an element such as a layer, film, region, or substrate is referred to as being "on" another element, it can be directly on the other element or intervening elements may also be present.

In contrast, when an element is referred to as being "directly on" another element, there are no intervening elements present.

First, a display device according to an exemplary embodiment will be schematically described with reference to the accompanying drawings.

FIG. 1 is a top plan view of a display device according to an exemplary embodiment, and for convenience, some of constituent elements are illustrated in FIG. 1.

A display device according to an exemplary embodiment includes a substrate 110 that is formed of a material such as glass, plastic, or the like, and a roof layer 360 formed on the substrate 110.

The substrate 110 includes a plurality of pixel areas PX.

The plurality of pixel areas PX are arranged in a matrix form that includes a plurality of pixel rows and a plurality of pixel columns.

A first valley V1 is positioned along a row direction of the pixel area between the plurality of pixel areas PX, and a second valley V2 is positioned between a plurality of pixel columns.

The second valley V2 according to the exemplary embodiment may include two valleys, and may include a microcavity 305b positioned between two valleys.

The roof layer 360 is formed along a direction of the pixel row.

In this case, injection holes 307a and 307b are formed in the first valley V1 such that the roof layer 360 is removed to expose the constituent element positioned under the roof layer 360.

Each roof layer 360 is formed to be separated from the substrate 110 between the adjacent second valleys V2, thereby forming microcavities 305a and 305b.

Further, each roof layer 360 is formed to be attached on the substrate 110 in the second valley V2 such that it covers opposite lateral surfaces of the microcavities 305a and 305b.

According to the exemplary embodiment, while being enclosed by the first and second valleys V1 and V2, the first microcavity 305a where a pixel electrode including a first subpixel electrode and a second suhpixel electrode is positioned is injected with a liquid crystal material through the first injection hole 307a.

In addition, while being enclosed by the first and second valleys V1 and V2, the second microcavity 305b where a shielding electrode 199 is positioned is injected with the liquid crystal material through the second injection hole 307b.

The aforementioned structure of the display device according to the exemplary embodiment is exemplarily provided and thus numerous variations thereof may be possible.

As an example, arrangement of the pixel areas PX, the first valley V1, and the second valley V2 may be changed, the plurality of roof layers 360 may be coupled to each other in the first valley V1, and each roof layer 360 may be partially formed to be separated from the substrate 110 in the second valley V2 such that the adjacent microcavities 305a and 305b are coupled to each other.

Next, one pixel of the display device according to the exemplary embodiment will be described with reference to FIGS. 2 to 9 along with FIG. 1.

Figure 2:
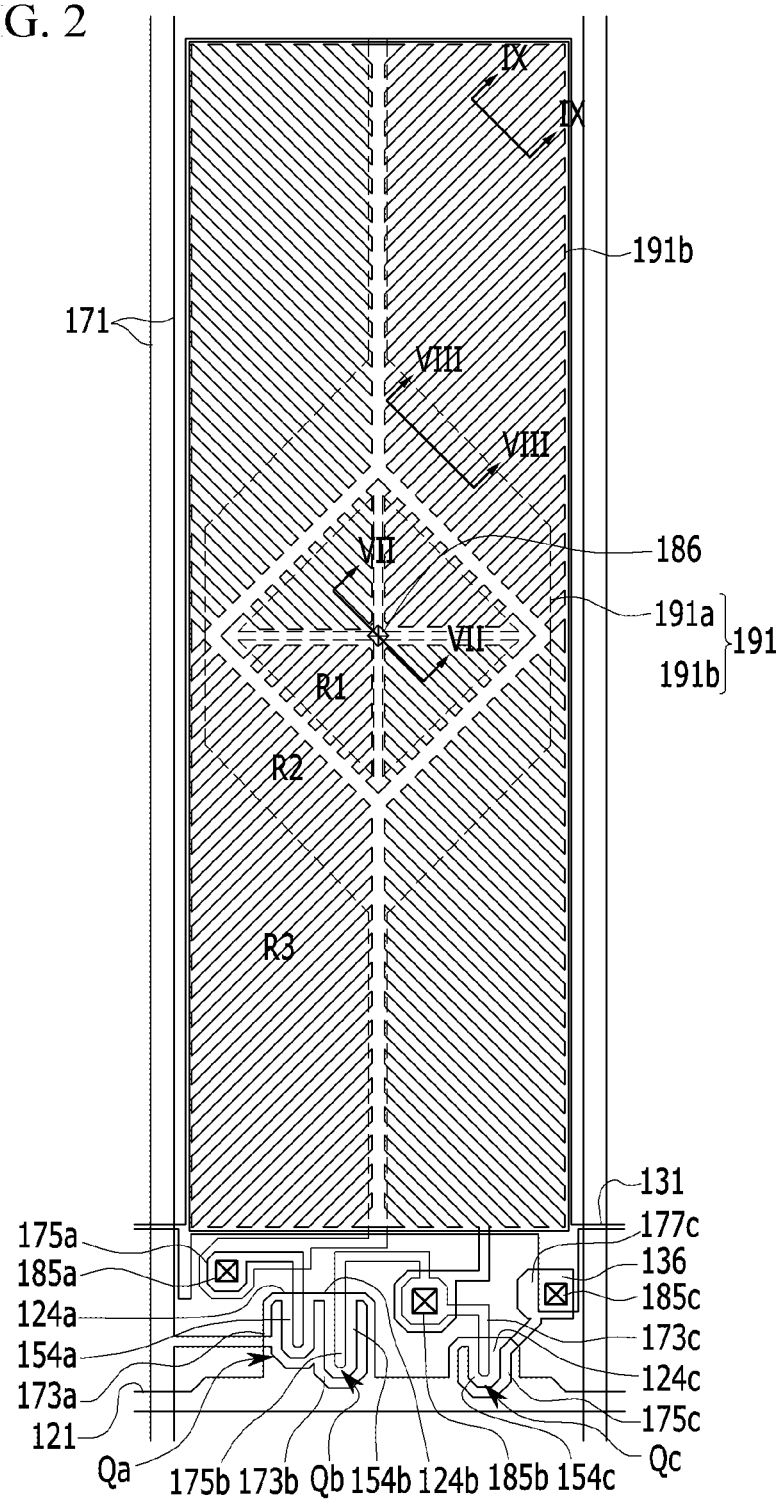
FIG. 2 is a top plan view of one pixel of the display device according to the exemplary embodiment.
Figure 3:
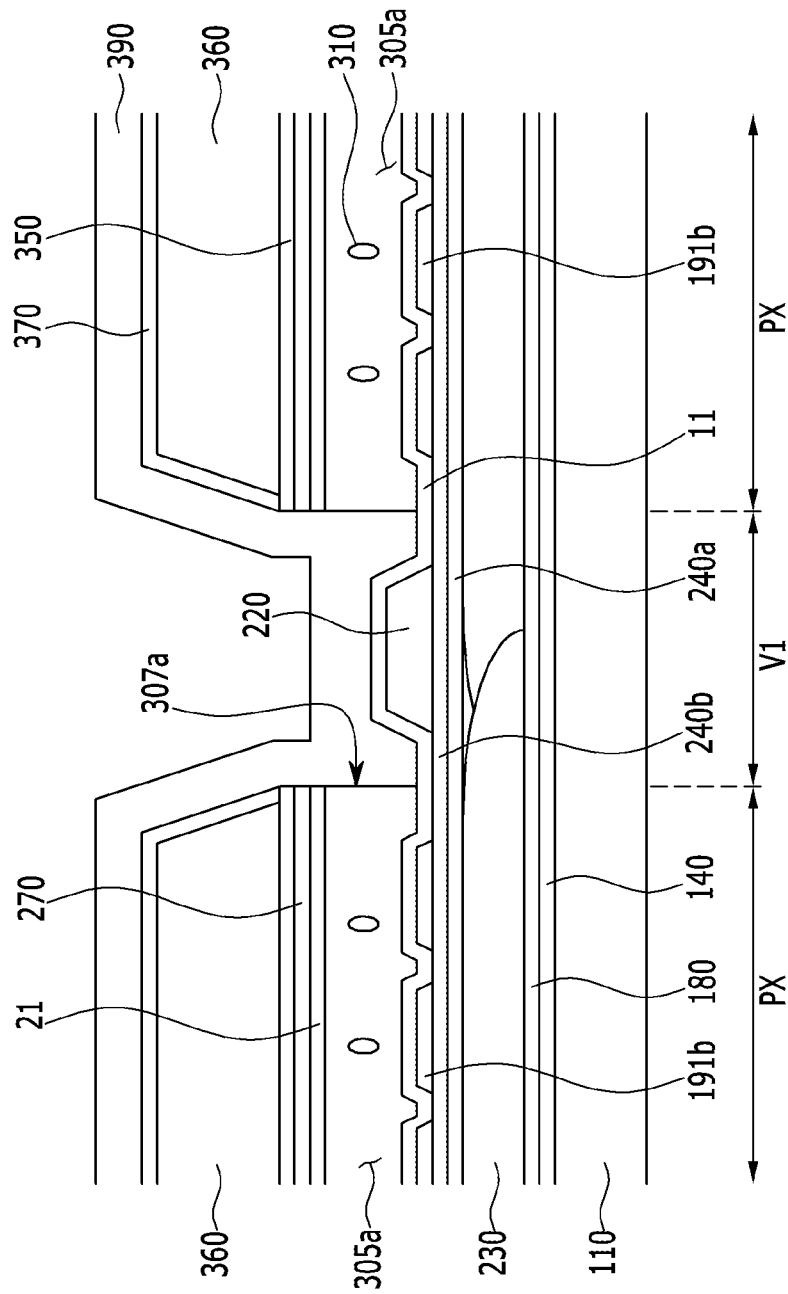
FIG. 3 is a partial cross-sectional view of the display device according to the exemplary embodiment taken along the line III-III of FIG. 1.
Figure 4:
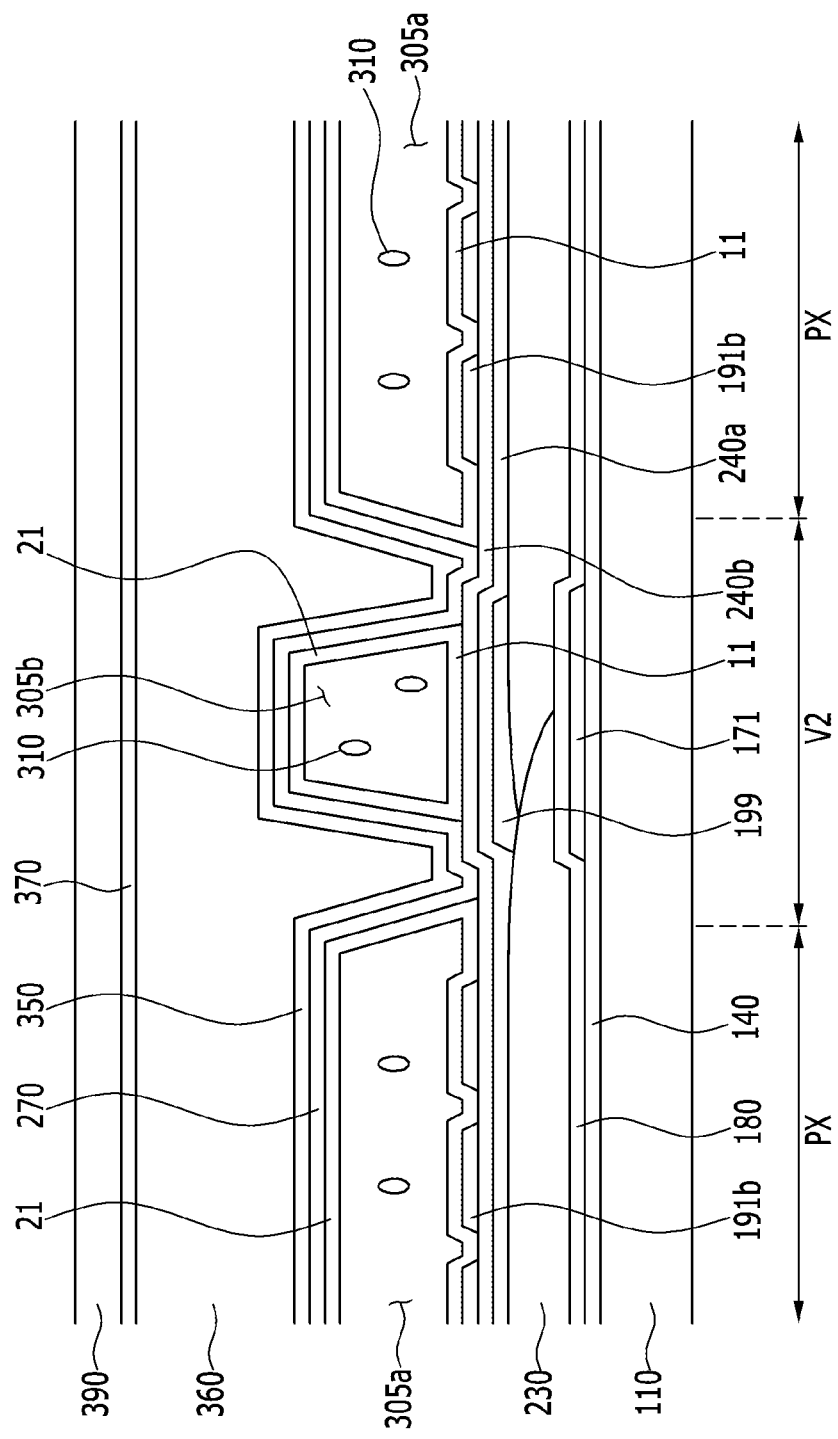
FIG. 4 is a partial cross-sectional view of the display device according to the exemplary embodiment taken along the line IV-IV of FIG. 1.

FIG. 2 is a top plan view of one pixel of the display device according to the exemplary embodiment, FIG. 3 is a partial cross-sectional view of the display device according to the exemplary embodiment taken along the line III-III of FIG. 1, and FIG. 4 is a partial cross-sectional view of the display device according to the exemplary embodiment taken along the line IV-IV of FIG. 1.

Figure 5:
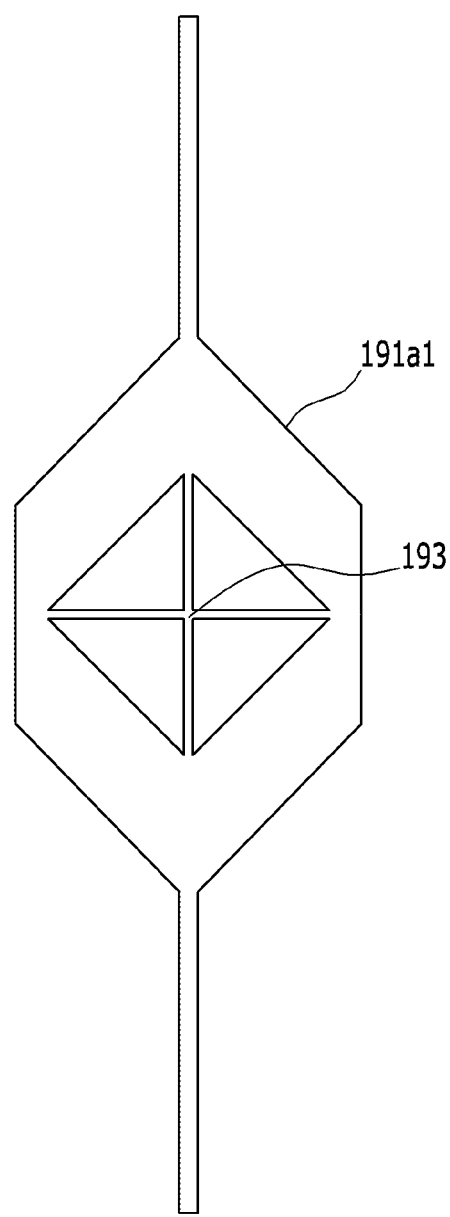
FIG. 5 is a partial top plan view of a first subpixel electrode according to the exemplary embodiment.
Figure 6:
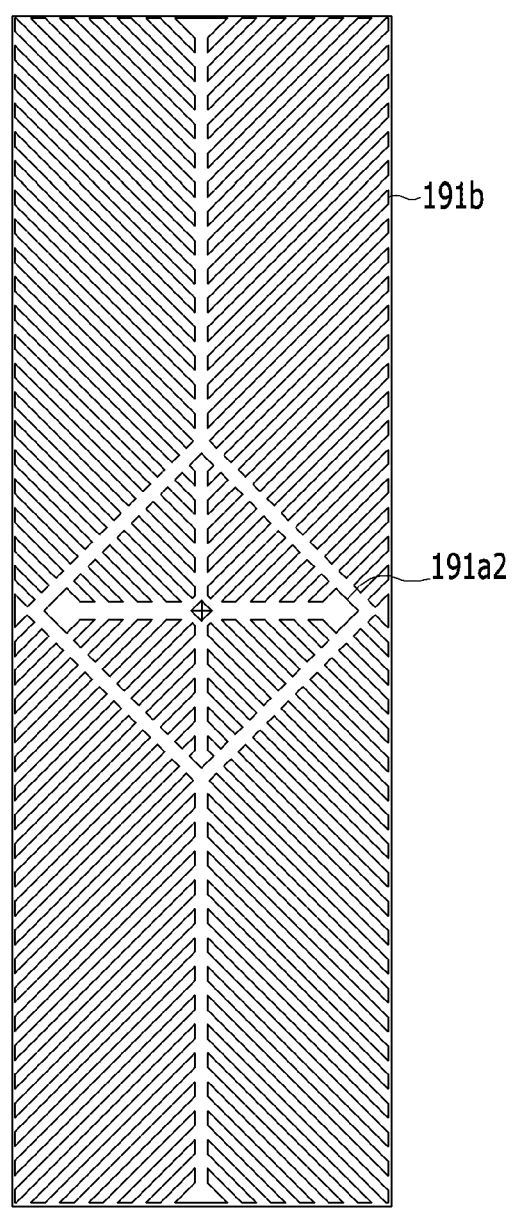
FIG. 6 is a top plan view of the first subpixel electrode and a second subpixel electrode according to the exemplary embodiment.
Figure 7:
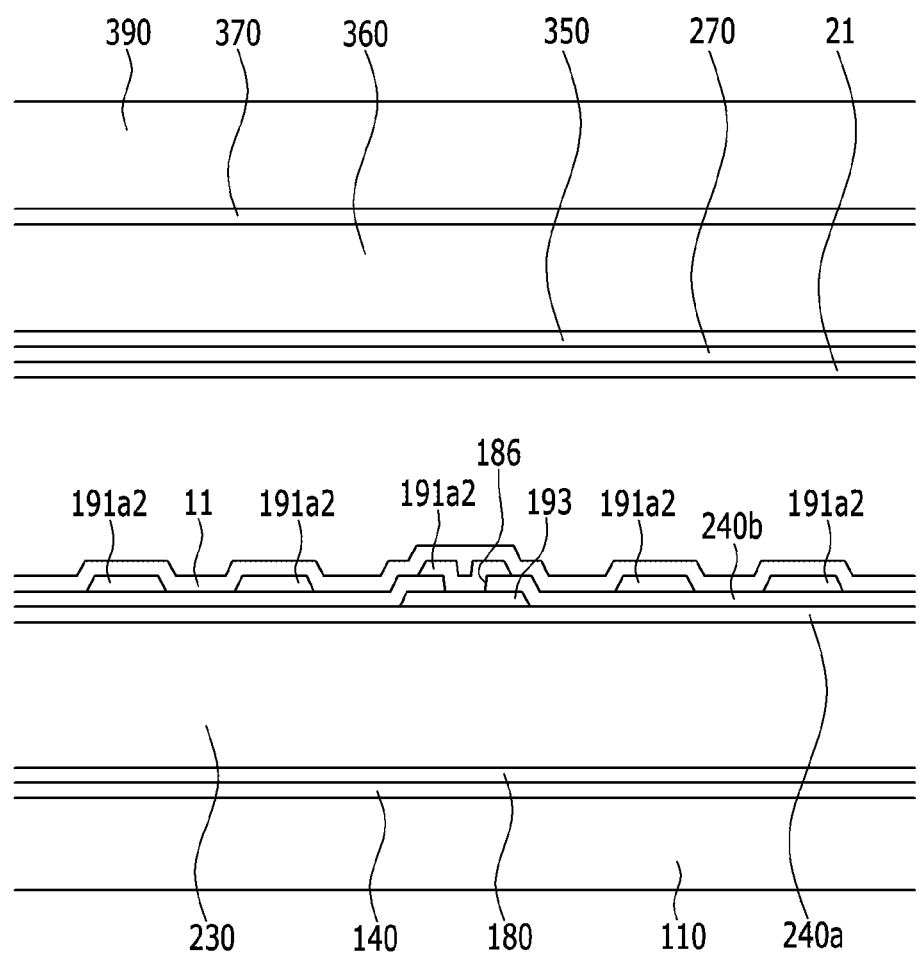
FIG. 7 is a cross-sectional view of FIG. 2 taken along the line VII-VII.
Figure 8:
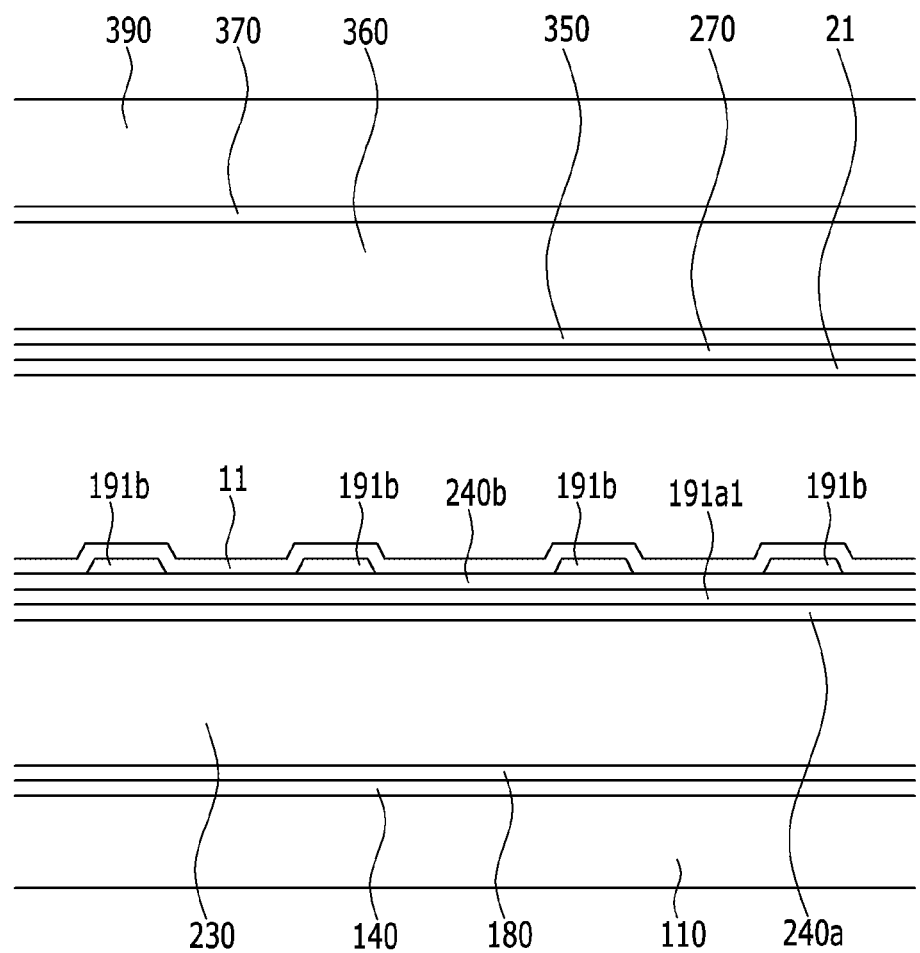
FIG. 8 is a cross-sectional view of FIG. 2 taken along the line
Figure 9:
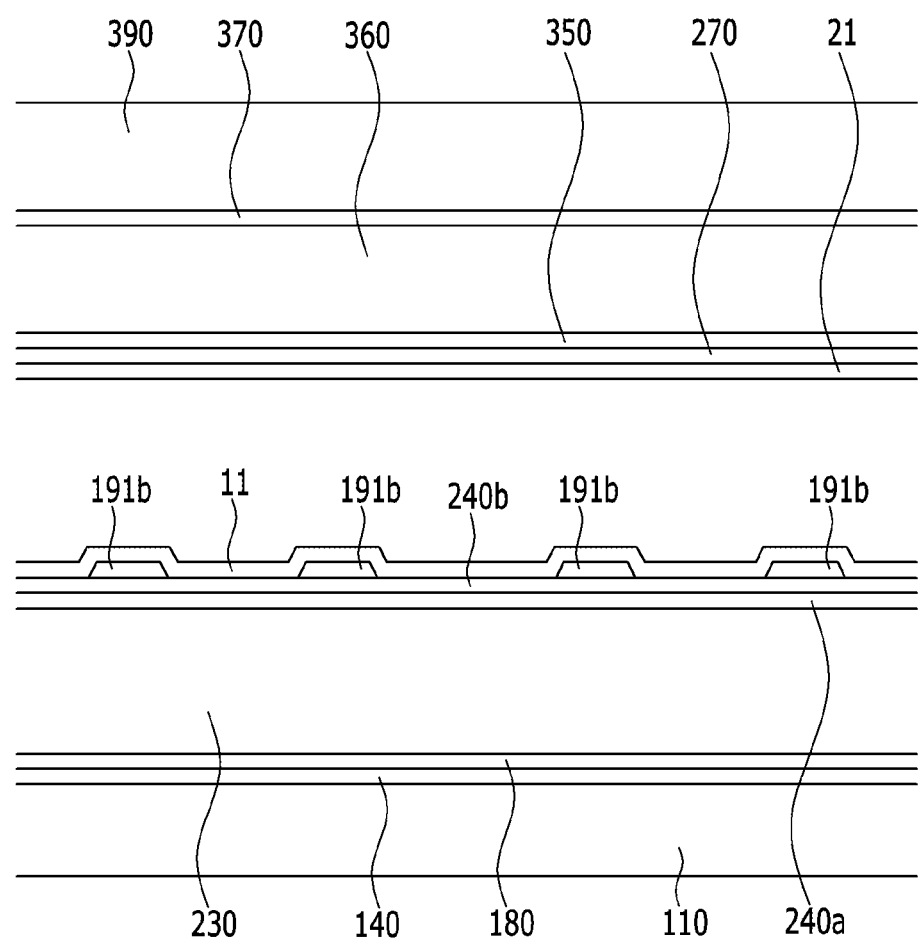
FIG. 9 is a cross-sectional view of FIG. 2 taken along the line IX-IX.

FIG. 5 is a partial top plan view of a first subpixel electrode according to the exemplary embodiment, FIG. 6 is a top plan view of the first subpixel electrode and a second subpixel electrode according to the exemplary embodiment, FIG. 7 is a cross-sectional view of FIG. 2 taken along the line FIG. 8 is a cross-sectional view of FIG. 2 taken along the line and FIG. 9 is a cross-sectional view of FIG. 2 taken along the line IX-IX.

First, referring to FIGS. 1 to 4, a gate line 121 and a reference voltage line 131 are positioned on the insulation substrate 110 that is formed of transparent glass, plastic, or the like.

The gate line 121 mainly extends in a horizontal direction and transmits a gate signal.

The gate line 121 includes a first gate electrode 124a, a second gate electrode 124b, a third gate electrode 124c, and a wide end portion (not shown) for connection with another layer or an external driving circuit The first gate electrode 124a and the second gate electrode 124b are coupled to each other to form one protruding portion.

In this case, protruding shapes of the first, second, and third gate electrodes 124a, 124b, and 124c may be modified.

The reference voltage line 131 mainly extends in a horizontal direction and transmits a predetermined voltage such as a common voltage Wont and the like.

The reference voltage line 131 may extend in parallel with the gate line 121 and include an expansion 136, and the expansion 136 may be coupled to a third drain electrode 175c to be described later.

A gate insulating layer 140 is positioned on the gate line 121, the reference voltage line 131, and the expansion 136.

The gate insulating layer 140 may be formed of an inorganic insulating material such as a silicon nitride (SiNx), a silicon oxide (SiOx), etc.

Further, the gate insulating layer 140 may be formed as a single layer or a multilayer.

A first semiconductor 154a, a second semiconductor 154b, and a third semiconductor 154c that can be formed of amorphous silicon or crystalline silicon are formed on the gate insulating layer 140.

The first semiconductor 154a may he positioned on the first gate electrode 124a, the second semiconductor 154b may be positioned on the second gate electrode 124b, and the third semiconductor 154c may he positioned on the third gate electrode 124c.

The first semiconductor 154a and the second semiconductor 154b may be coupled to each other, and the second semiconductor 154b and the third semiconductor 154c may also be coupled to each other.

In addition, the first semiconductor 154a may be further elongated to be positioned under a data line 171.

The first to third semiconductors 154a, 154b, and 154c may be formed of amorphous silicon, polycrystalline silicon, a metal oxide, etc.

In addition, ohmic contacts (not shown) may be respectively formed on the first to third semiconductors 154a, 154b, and 154c.

The ohmic contacts may be formed of a material such as n+ hydrogenated amorphous silicon in which a silicide or n-type impurity is doped at a high concentration.

When the semiconductors 154a, 154b, and 154c are oxide semiconductors, the ohmic contacts may be omitted.

Data conductors including the data line 171, a first source electrode 173*a*, a second source electrode 173*b*, a third source electrode 173*c*, a first drain electrode 175*a*, a second drain electrode 175*b*, and the third drain electrode 175*c* is positioned on the first to third semiconductor 154*a*, 154*b*, and 154*c*.

The second drain electrode 175*b* is coupled to the third source electrode 173*c*.

The data lines 171 transmit a data signal and mainly extend in a vertical direction to cross gate line 121.

Each data line 171 extends toward the first and second gate electrodes 124*a* and 124*b* and includes the first and second source electrodes 173*a* and 173*b* that are coupled to each other.

The first drain electrode 175*a*, the second drain electrode 175*b*, and the third drain electrode 175*c* each include one wide end portion and the other rod-shaped end portion.

The rod-shaped end portions of the first and second drain electrode 175*a* and 175*b* are partially enclosed by the first and second source electrodes 173*a* and 173*b*. The one wide end portion of the second drain electrode 175*b* extends again to form the third source electrode 173*c* that is in the shape of an 'I'.

A wide end portion 177*c* of the third drain electrode 175*c* overlaps the expansion 136 and is connected thereto through a contact hole 185*c*.

The data conductors 171, 173*a*, 173*b*, 173*c*, 175*a*, 175*b*, and 175*c* and the ohmic contacts therehelow may substantially have the same planar shape except for channel regions between the source electrodes 173*a*, 173*b*, and 173*c* and the drain electrodes 175*a*, 175*b*, and 175*c*, The first gate electrode 124*a*, the first source electrode 173*a*, and the first drain electrode 175*a* form a first thin film transistor Qa along with the first semiconductor 154*a*, and a channel of the thin film transistor Qa is formed in the semiconductor portion 154*a* between the first source electrode 173*a* and the first drain electrode 175*a*.

Similarly, the second gate electrode 124*b*, the second source electrode 173*b*, and the second drain electrode 175*b* form a second thin film transistor Qb along with the second semiconductor 154*b*, and a channel of the thin film transistor Qb is formed in the semiconductor portion 154*b* between the second source electrode 173*b* and the second drain electrode 175*b*. The third gate electrode 124*c*, the third source electrode 173*c*, and the third drain electrode 175*c* form a third thin film transistor Qc along with the third semiconductor 154*c*, and a channel of the thin film transistor Qc is formed in the semiconductor portion 154*c* between the third source electrode 173*c* and the third drain electrode 175*c*.

A passivation layer 180 that can be formed of an inorganic insulator such as a silicon nitride, a silicon oxide, or the like is positioned on the data conductors 171, 173*a*, 173*b*, 173*c*, 175*a*, 175*b*, and 175*c* and the exposed semiconductor portions 154*a*, 154*b*, and 154*c*.

The passivation layer 180 may be formed of an organic insulating material or an inorganic insulating material, and may be formed as a single layer or a multilayer.

A color filter 230 is formed on the passivation layer 180 in each pixel area PX.

Each color filter 230 may display one of three primary colors such as red, green, and blue.

The color filter 230 is not limited to displaying the three primary colors of red, green, and blue, but may display colors such as cyan, magenta, yellow, and white-based colors.

Unlike as shown in the drawing, the color filter 230 may be elongated in a column direction along the adjacent data lines 171.

A first insulating layer 240*a* may be further formed on the color filter 230.

The first insulating layer 240*a* may be formed of an inorganic insulating material such as a silicon nitride (SiNx), a silicon oxide (SiOx), a silicon oxynitride (SiOxNy), etc.

The first insulating layer 240*a* prevents the color filter 230 from being lifted and suppresses contamination of the liquid crystal layer by an organic material such as a solvent that comes from the color filter 230, thereby preventing defects such as a residual image occurrable when a screen is driven.

A first subregion 191*a*1 of a first subpixel electrode 191*a* and the shielding electrode 199 are positioned on the first insulating layer 240*a*.

Referring to FIG. 5, the first subregion 191*a*1 of the first subpixel electrode 191*a* has a planar shape including a cross-shaped connecting portion positioned at a center of the pixel area and four parallelograms that are positioned around the cross-shaped connecting portion to enclose the cross-shaped connecting portion.

An expansion 193 is positioned at the center of the cross-shaped connecting portion.

In addition, the first subregion 191*a*1 of the first subpixel electrode 191*a* includes a protruding portion that upwardly and downwardly extends from a horizontal center portion of the pixel area.

As such, the first subregion 191*a*1 of the first subpixel electrode 191*a* is positioned on a part of the pixel area.

Referring to FIG. 6, a second subregion 191*a*2 of the first subpixel electrode 191*a* is positioned at a center of the pixel and has a substantially rhombus shape.

The second subregion 191*a*2 of the first subpixel electrode 191*a* includes a cross-shaped stem portion including a horizontal portion and a vertical portion, and a plurality of first branch electrodes extending from the cross-shaped stem portion.

The first branch electrodes extend in four directions.

A second subpixel electrode 191*b* includes a part overlapping the first subregion 191*a*1 of the first subpixel electrode 191*a* and the other part.

The part of the second subpixel electrode 191*b* and the first subregion 191*a*1 of the first subpixel electrode 191*a* overlap each other while interposing the insulating layer, specifically, a second insulating layer 240*b* therebetween, and the second subregion 191*a*2 of the first subpixel electrode 191*a* includes a plurality of second branch electrodes that extend in the same direction as the plurality of first branch electrodes.

In the passivation layer 180, the first insulating layer 240*a*, and a second insulating layer 240*b*, a first contact hole 185*a* is formed to extend to and partially expose the first drain electrode 175*a*, and a second contact hole 185*b* is formed to extend to and partially expose the second drain electrode 175*b*.

In addition, in the second insulating layer 240*b*, a third contact hole 186 is formed to expose a center portion of the first subregion 191*a*1 of the first subpixel electrode 191*a*.

The first subregion 191*a*1 of the first subpixel electrode 191*a* is physically and electrically coupled to the first drain electrode 175*a* through the first contact hole 185*a*, and the second subpixel electrode 191*b* is physically and electrically coupled to the second drain electrode 175*b* through the second contact hole 185*b*.

In addition, the second subregion 191*a*2 of the first subpixel electrode 191*a* is coupled to the expansion 193 of the first subregion 191a1 of the first suhpixel electrode 191a through the third contact hole 186 that is formed in the second insulating layer 240b.

The first and second suhpixel electrodes 191a and 191b are respectively applied with a data voltage from the first and second drain electrodes 175a and 175b through the first and second contact holes 185a and 185b.

The shielding electrode 199 is positioned on the data line 171 to overlap it, and particularly, may have a shape that is identical or similar to a planar shape of the data line 171.

The shielding electrode 199 is positioned at opposite sides of one pixel area along an edge thereof above the data lines 171.

The shielding electrode 199 may not be separately positioned in each pixel area but may be formed as a continuum across all of the adjacent pixels.

The shielding electrode 199 may be formed of a transparent conductive material such as ITO (indium tin oxide), IZO (indium zinc oxide), or the like, or a reflective metal such as aluminum, silver, chromium, or an alloy thereof.

That is, the shielding electrode 199 may be formed of the same material as or different materials from the first subregion 191a1 of the first suhpixel electrode 191a.

The shielding electrode 199 and the first subregion 191a1 of the first suhpixel electrode 191a may be simultaneously formed using the same mask.

That is, the shielding electrode 199 may be positioned on the same layer as the first subregion 191a1 of the first suhpixel electrode 191a.

Since the shielding electrode 199 is applied with the same voltage as a common electrode 270, no electric field is generated between the shielding electrode 199 and the common electrode 270 and thus liquid crystal molecules between the shielding electrode 199 and the common electrode 270 are not aligned.

Thus, the liquid crystals positioned therebetween are in a black state and thus may serve as a light blocking member.

Accordingly, in the display device according to the exemplary embodiment, the light blocking function can be performed by the shielding electrode 199 as well as a light blocking member 220 to be described.

The light blocking member 220 is positioned, as shown in FIG. 3, in a region where the adjacent color filters 230 overlap.

The light blocking member 220 may be formed in a border section of the pixel areas PX and on the thin film transistor, e.g., thin film transistors Qa, Qb, Qc, to prevent light leakage.

The color filter 230 may be formed in each pixel area PX, and the light blocking member 220 may be formed between the adjacent pixel areas PX.

The light blocking member 220 upwardly and downwardly extends along the gate line 121, and may be a horizontal light blocking member 220 that covers a region where the first thin film transistor Qa, the second thin film transistor Qh, and the third thin film transistor Qc are positioned.

That is, the light blocking member 220 may be formed in the first valley V1.

The color filter 230 and the light blocking member 220 may partially overlap each other in some regions.

The arrangement of the pixel area, the structure of the thin film transistor, and the shape of the pixel electrode described above are just one example, and the embodiments are not limited thereto and thus can be variously modified.

The common electrode 270 is formed on a pixel electrode 191 such that it is separated from the pixel electrode 191 by a predetermined distance. The pixel electrode 191 includes the first subpixel electrode 191a and the second subpixel electrode 191b.

The first microcavity 305a is formed between the pixel electrode 191 and the common electrode 270.

That is, the microcavity 305a is enclosed by the pixel electrode 191 and the common electrode 270.

The microcavity 305a may have various widths and sizes depending on sizes and resolutions of the display devices.

The second microcavity 305b is formed between the shielding electrode 199 and the common electrode 270.

The second microcavity 305b is enclosed by the shielding electrode 199 and the common electrode 270.

The common electrode 270 may be formed of a transparent metallic material such as indium tin oxide (ITO), indium zinc oxide (IZO), etc.

A fixed voltage may be applied to the common electrode 270, and an electric field may be generated between the pixel electrode 191 and the common electrode 270.

Since the shielding electrode 199 is applied with the same voltage as the common electrode 270, liquid crystal molecules 310 positioned in the second microcavity 305b are not aligned.

Accordingly, the liquid crystals positioned therebetween are in the black state and thus may serve as the light blocking member.

A first alignment layer 11 is positioned on the pixel electrode 191, the shielding electrode 199, and the light blocking member 220.

The first alignment layer 11 may be formed directly on the shielding electrode 199, the light blocking member 220, and the second insulating layer 240b that are not covered by the pixel electrode 191.

A second alignment layer 21 is formed under the common electrode 270 to face the first alignment layer 11.

The first and second alignment layers 11 and 21 may be formed as vertical alignment layers, and may be formed of an aligning material such as polyamic acid, polysiloxane, or polyimide.

The first and second alignment layers 11 and 21 may he coupled to each other at an edge of the pixel area PX or at an edge of the second microcavity 305b.

A liquid crystal layer consisting of liquid crystal molecules 310 is formed in the first microcavity 305a between the pixel electrode 191 and the common electrode 270 and in the second microcavity 305b between the shielding electrode 199 and the common electrode 270.

The liquid crystal molecules 310 have negative dielectric anisotropy, and may be aligned in a direction perpendicular to the substrate 110 when no electric field is applied.

That is, a vertical alignment may be achieved.

However, since the shielding electrode 199 is applied with the same voltage as the common electrode 270, the liquid crystal molecules 310 positioned in the second microcavity 305b are not aligned.

Accordingly, the liquid crystals positioned therebetween are always in the black state and thus may serve as the light blocking member.

On the contrary, the first and second subpixel electrodes 191a and 191b to which the data voltage is applied generate an electric field along with the common electrode 270, thereby determining directions of the liquid crystal molecules 310 that are positioned in the microcavity 305a between the two electrodes 191 and 270.

Depending on the determined directions of the liquid molecules 310 as such, luminance of light passing through liquid crystal layer varies.

A third insulating layer 350 may be further formed on the common electrode 270.

The third insulating layer 350 may be formed of an inorganic insulating material such as a silicon nitride (SiNx), a silicon oxide (SiOx), a silicon oxvnitride (SiOxNy), etc., and may be omitted if necessary.

The roof layer 360 is positioned on the third insulating layer 350.

The roof layer 360 may be formed of an organic material.

The microcavities 305a and 305b are formed under the roof layer 360, and the roof layer 360 may be hardened by a hardening process to maintain a shape of the microcavities 305a and 305b.

That is, the roof layer 360 is formed to be separated from the pixel electrode 191 while interposing the microcavities 305a and 305b therebetween.

The roof layer 360 is formed in each pixel area PX and in the second valley V2 along the pixel row, but is not formed in the first valley V1.

In each pixel area PX, the first microcavity 305a is formed under the roof layer 360.

The second valley V2 according to the exemplary embodiment is provided as a pair between adjacent pixel areas, and the second microcavity 305b is formed to be positioned under the roof layer 360 between the two second valleys V2.

In the second valley, the roof layer 360 is formed to be attached to the substrate 110.

Accordingly, a thickness of the roof layer 360 positioned in the second valley V2 may be formed to be larger than that of the roof layer 360 positioned in each pixel area PX.

Top and lateral surfaces of the microcavity 305 are formed such that they are covered by the roof layer 360.

In the common electrode 270, the third insulating layer 350, and the roof layer 360, the injection holes 307a and 307b are formed to extend to and partially expose the microcavities 305a and 305b.

The injection holes 307a and 307b may be formed to face each other at the edge of the pixel area PX.

That is, the injection holes 307a and 307b may be formed to expose the lateral surfaces of the microcavities 305a and 305b while allowing a lower side of one pixel area PX and an upper side of the other adjacent pixel area PX to face each other.

Since the microcavities 305a and 305b are exposed by the injection holes 307a and 307b, an aligning agent or liquid crystal material may be injected into the microcavities 305a and 305b through the injection holes 307a and 307b.

A fourth insulating layer 370 may he formed on the roof layer 360.

In addition, an overcoat 390 may be formed on the fourth insulating layer 370.

The overcoat 390 is formed to cover the injection holes 307a and 307b through which the microcavities 305a, 305b are partially exposed outside.

That is, the overcoat 390 may seal the microcavities 305a and 305b such that the liquid crystal molecules 310 inside the microcavities 305a and 305b are not discharged outside.

The overcoat 390 is preferably formed of a material that does not react with the liquid crystal molecules 310 since it contacts the liquid crystal molecules 310.

For example, the overcoat 390 may be formed of parylene and the like.

The overcoat 390 may be formed as a multilayer such as a double layer, a triple layer, etc.

The double layer consists of two layers that are formed of different materials.

The triple layer consists of three layers in which forming materials of the adjacent layers are different.

For example, the overcoat 390 may include a layer formed of an organic insulating material and a layer formed of an inorganic insulating material.

Though not illustrated, polarizers may be further formed on top and bottom surfaces of the display device.

The polarizers may include a first polarizer and a second polarizer.

The first polarizer may be attached to a bottom surface of the substrate 110, and the second polarizer may be attached on the overcoat 390.

Now, a first region R1, a second region R2, and a third region R3 included in one pixel area of the LCD according to the present exemplary embodiment will be described in detail with reference to FIG. 2 along with FIGS. 7 to 9.

Referring to FIGS. 2 and 7, in the first region R1 of one pixel area of the LCD according to the present exemplary embodiment, the second subregion 191a2 of the first subpixel electrode 191a coupled to the expansion 193 of the first subregion 191a1 of the first subpixel electrode 191a and the common electrode 270 generate the electric field.

In this case, the second subregion 191a2 of the first subpixel electrode 191a includes the cross-shaped stem portion and the plurality of first branch electrodes extending in four different directions.

The plurality of first branch electrodes may be inclined at an angle of about 40° to about 45° with respect to the gate line 121.

Due to a fringe field generated by edges of a plurality of the first branch electrodes, the liquid crystal molecules 310 of the liquid crystal layer positioned in the first region R1 lie in four different directions.

More specifically, since a horizontal component of the fringe field due to the plurality of first branch electrodes is substantially in parallel with sides of the plurality of first branch electrodes, the liquid crystal molecules are inclined toward a direction parallel to a length direction of the plurality of first branch electrodes.

Referring back to FIGS. 2 and 8, in the second region R2 of one pixel area of the LCD according to the present exemplary embodiment, the first subregion 191a1 of the first subpixel electrode 191a and a part of the second subpixel electrode 191b overlap each other.

The liquid crystal molecules 310 of the liquid crystal layer are aligned by an electric field generated between a part of the second subpixel electrode 191b and the common electrode 270, an electric field generated between the first subregion 191a1 of the first subpixel electrode 191a that is positioned between the plurality of second branch electrodes of the second subpixel electrode 191b and the common electrode 270, an electric field generated between a part of second subpixel electrode 191b and the first subregion 191a1 of the first subpixel electrode 191a.

Next, referring to FIGS. 2 and 9, in the third region R3 of one pixel area of the LCD according to the present exemplary embodiment, the other part of the second subpixel electrode 191b and the common electrode 270 generate an electric field.

As described above, the second voltage applied to the second subpixel electrode 191b is smaller than the first voltage applied to the first subpixel electrode 191a.

Thus, intensity of the electric field applied to the liquid crystal layer positioned in the first region R1 is greatest, while intensity of the electric field applied to the liquid crystal layer positioned in the third region R3 is smallest.

Since the electric field of the first subpixel electrode 191a positioned under the second subpixel electrode 191b affects the second region R2, intensity of the electric field applied to the liquid crystal layer positioned in the second region R2 is smaller than that applied to the liquid crystal layer positioned in the first region R1 and is greater than that applied to the liquid crystal layer positioned in the third region R3.

As such, in the LCD according to the exemplary embodiment, one pixel area is split into the first region R1 where the second subregion 191a2 of the first subpixel electrode 191a to which the relatively high first voltage is applied is positioned, the second region R2 where the first subregion 191a1 of the first subpixel electrode 191a and a part of the second subpixel electrode 191b overlap each other while interposing the insulating layer therebetween, and the third region R3 where the other part of the second subpixel electrode 191b to which the relatively low second voltage is applied is positioned.

Accordingly, since the intensities of the electric fields applied to the liquid crystal molecules 310 corresponding to the first region R1, the second region R2, and the third region R3 are different, inclination angles of the liquid crystal molecules 310 are different, thereby making luminances of the respective regions different.

As such, when one pixel area is split into the three regions having different luminances, transmittance is prevented from being abruptly changed at lateral sides even at a low grayscale or high grayscale by smoothly controlling the transmittance according to grayscale, thereby making gray expression accurate even at low or high gray levels as well as making side visibility similar to front visibility.

Now, a driving method of a LCD according to the present exemplary embodiment will be schematically described.

When a gate-on signal is applied to a gate line 121, the gate-on signal is applied to a first gate electrode 124a, a second gate electrode 124b, and a third gate electrode 124c, thereby turning on a first switching element Qa, a second switching element Qb, and a third switching element Qc.

Accordingly, a data voltage applied to a data line 171 is applied to both a first subpixel electrode 191a and a second subpixel electrode 191b through the turned-on first and second switching elements Qa and Qb.

In this case, the same voltage is applied to the first subpixel electrode 191a and the second subpixel electrode 191b.

However, the voltage applied to the second subpixel electrode 191b is divided by the third switching element Qc that is connected in series with the second switching element Qb.

Thus, the voltage applied to the second subpixel electrode 191b is smaller than the voltage applied to the first subpixel electrode 191a.

Referring back to FIG. 2, one pixel area of an LCD according to the present exemplary embodiment includes a first region R1 where a second subregion 191a2 of the first subpixel electrode 191a is positioned, a second region R2 where a part of a first subregion 191a1 of the first subpixel electrode 191a overlaps a part of the second subpixel electrode 191b, and a third region R3 where the other part of the second subpixel electrode 191b is positioned.

The first region R1, the second region R2, and the third region R3 respectively include four subregions. A size of the second region R2 may be about twice the size of the first region R1, and a size of the third region R3 may be about twice the size of the second region R2.

Now, a manufacturing method of a display device according to an exemplary embodiment will be described with reference to FIGS. 10 to 19.

The manufacturing method will be described with further reference to FIGS. 1 to 4.

FIGS. 10 to 19 are process cross-sectional views illustrating the manufacturing method of the display device according to the exemplary embodiment.

Figure 10:
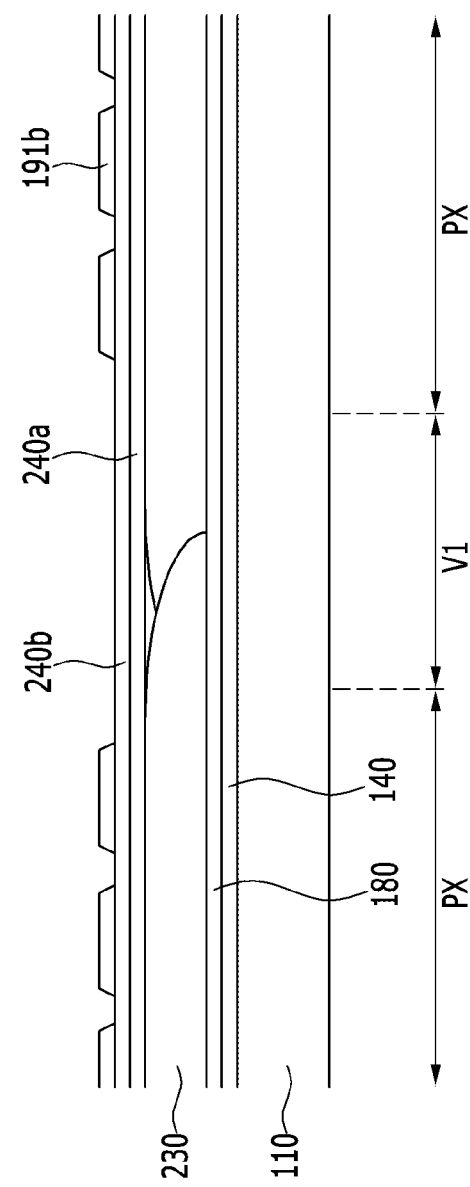
FIGS. 10, 11, 12, 13, 14, 15, 16, 17, 18, 19 are cross-sectional views of FIG. 1 taken along the lines III-III and IV-IV according to a manufacturing process.
Figure 11:
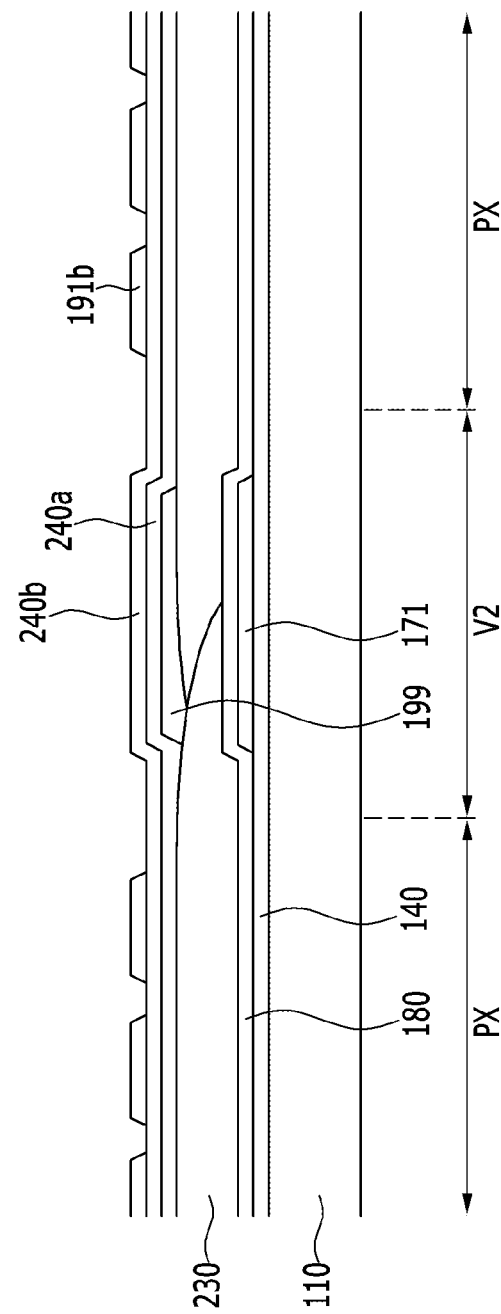

First, as shown FIGS. 10 and 11, a gate line 121 and a reference voltage line 131 that extend in one direction are formed on a substrate 110 that is formed of glass or plastic, and a first gate electrode 124a, a second gate electrode 124b, and a third gate electrode 124c are formed to protrude from the gate line 121.

Next, a gate insulating layer 140 is formed on an entire surface of the substrate 110 including the gate line 121 and the reference voltage line 131, using an inorganic insulating material such as a silicon oxide (SiOx) or silicon nitride (SiNx).

The gate insulating layer 140 may be formed as a single layer or a multilayer.

Next, a semiconductor material such as amorphous silicon, polycrystalline silicon, a metal oxide, etc. is deposited on the gate insulating layer 140, and is then patterned to form a first semiconductor 154a, a second semiconductor 154b, and a third semiconductor 154c.

The first semiconductor 154a may be formed on the first gate electrode 124a, the second semiconductor 154b may be formed on the second gate electrode 124b, and the third semiconductor 154c may be formed on the third gate electrode 124c.

Next, a metallic material is deposited and is then patterned to form a data line 171 that extends in the other direction.

The metallic material may be formed as a single layer or a multilayer.

In addition, a first source electrode 173a protruding above the first gate electrode 124a from the data line 171 and a first drain electrode 175a separated from the first source electrode 173a are integrally formed.

In addition, a second source electrode 173b coupled to the first source electrode 173a and a second drain electrode 175b separated from the second source electrode 173b are integrally formed.

In addition, a third source electrode 173c extending from the second drain electrode 175b and a third drain electrode 175c separated from the third source electrode 173c are integrally formed.

The semiconductor material and the metallic material may be sequentially deposited and simultaneously patterned to form the first to third semiconductors 154a, 154b, and 154c, the data line 171, the first to third source electrode 173a, 173b, and 173c, and the first to third drain electrodes 175a, 175b, and 175c.

In this case, the first semiconductor 154a is formed such that it is elongated under the data line 171.

The first/second/third gate electrodes (124a/124b/124c), the first/second/third source electrodes (173a/173b/173c), and the first/second/third drain electrodes (175a/175b/175c) form first/second/third thin film transistors (Qa/Qb/Qc) along with the first/second/third semiconductors (154a/154b/154c), respectively.

Next, a passivation layer 180 is formed on the data line 171, the first to third source electrodes 173a, 173b, and 173c, the first to third drain electrodes 175a, 175b, and 175c, and the exposed semiconductors 154a, 154b, and 154c between the respective source electrodes (173a/173b/173c) and the respective drain electrodes (175a/175b/175c).

The passivation layer 180 may be formed of an organic insulating material or inorganic insulating material, and may be formed as a single layer or a multilayer.

Next, a color filter 230 is formed on the passivation layer 180 in each pixel area PX.

Each color filter 230 may be formed in each pixel area PX but may not be formed in the first valley V1.

Further, the color filters 230 of the same color may be formed along a column direction of the plurality of pixel areas PX.

When forming the color filters 230 of three colors, the color filter 230 of a first color is formed first and then a mask is shifted to form the color filter 230 of a second color. Next, after forming the color filter 230 of the second color, the mask is shifted to form the color filter 230 of a third color.

Next, a first insulating layer 240a is formed on the color filter 230 using an inorganic insulating material such as a silicon nitride (SiNx), a silicon oxide (SiOx), a silicon oxynitride (SiOxNy), etc.

Next, the passivation layer 180, the color filter 230, and the first insulating layer 240a are etched to form a first contact hole 185a which extends to and through which the first drain electrode 175a is partially exposed.

Next, a transparent metallic material such as indium tin oxide (ITO), indium zinc oxide (IZO), or the like is deposited on the first insulating layer 240a and is then patterned to form a first subregion 191a1 of a first subpixel electrode 191a in the pixel area PX.

The first subregion 191a1 of the first subpixel electrode 191a is formed to be coupled to the first drain electrode 175a through the first contact hole 185a.

In this case, the metallic material is patterned to form both the first subregion 191a1 and a shielding electrode 199. Then, the first subregion 191a1 and the shielding electrode 199 may be simultaneously formed.

The shielding electrode 199 is positioned on the data line 171 to overlap it, and particularly, and may have a shape that is identical or similar to a planar shape of the data line 171.

The shielding electrode 199 is positioned at opposite sides of one pixel area along an edge thereof above the data lines 171.

The shielding electrode 199 may not be separately positioned in each pixel area, but may be formed as a continuum across all of the adjacent pixels.

Next, a second insulating layer 240b is formed on the first subregion 191a1.

In this case, the second insulating layer 240b forms a third contact hole 186 through which the first subregion 191a1 is coupled to the second subregion 191a2, and the second insulating layer 240b, the first insulating layer 240a, the color filter 230, and the passivation layer 180 form a second contact hole 185b through which the second drain electrode 175b is exposed.

A second subregion 191a2 of the first subpixel electrode 191a and a second subpixel electrode 191b are formed on the second insulating layer 240b.

The second subregion 191a2 of the first subpixel electrode 191a is coupled to the first subregion 191a1 through the contact hole 186, and the second subpixel electrode 191b is coupled to the second drain electrode 175b through the second contact hole 185b to be applied with a voltage.

Figure 12:
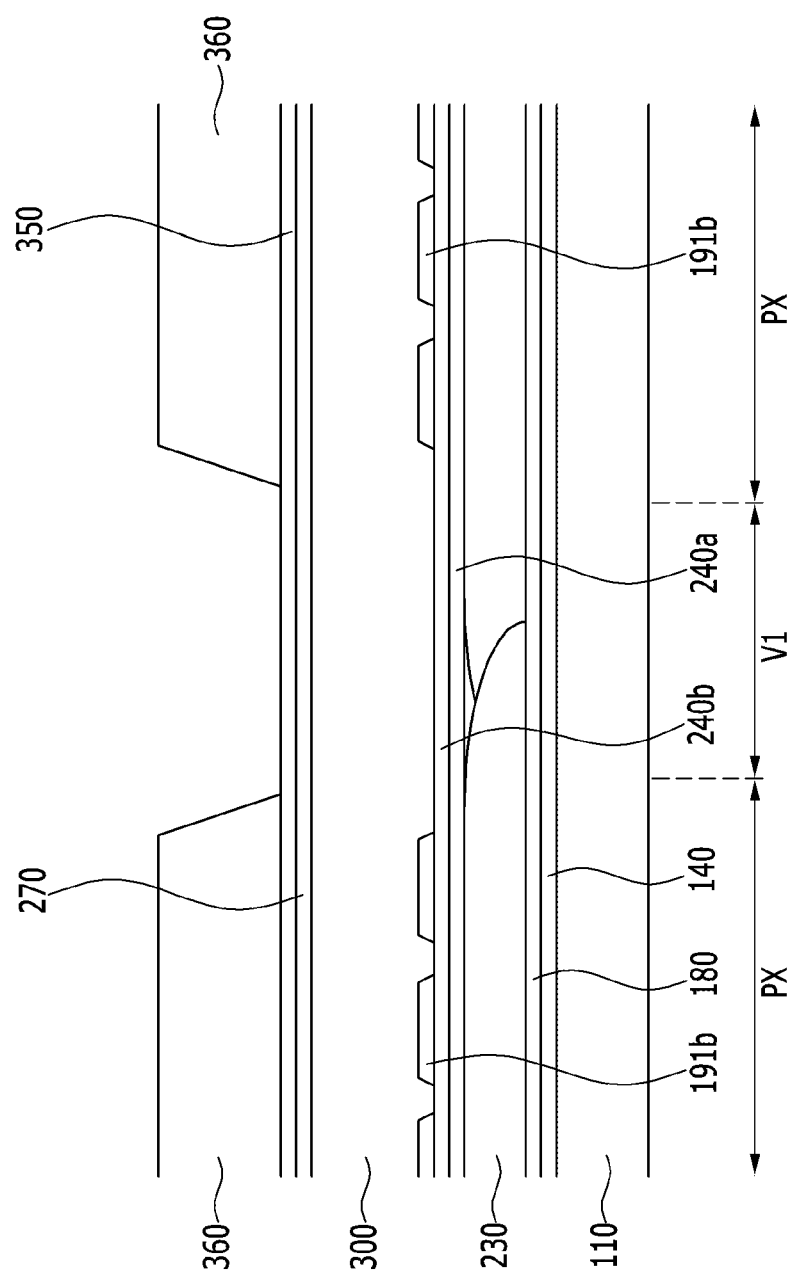
Figure 13:
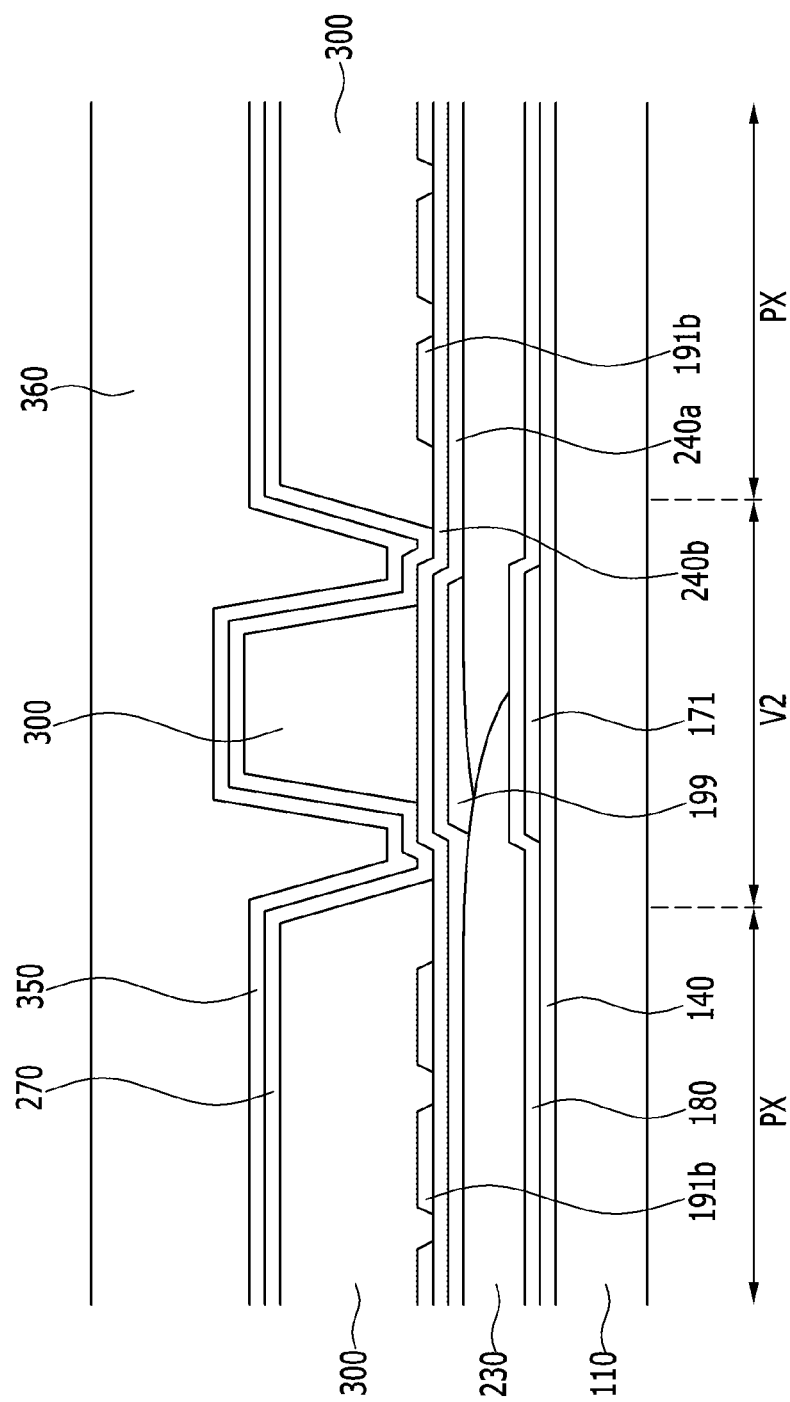

Next, as shown in FIGS. 12 and 13, a photosensitive organic material is coated on the pixel electrode 191, and a photolithography process is performed to form a sacrificial layer 300.

The sacrificial layer 300 is formed to be connected along a plurality of pixel columns.

That is, the sacrificial layer 300 is formed to cover every pixel area PX.

Further, the sacrificial layer 300 is formed to cover a region where the shielding electrode 199 is formed, as well as a region where the pixel electrode 191 is formed.

In this case, the sacrificial layer 300 covering the pixel area may be separated from the sacrificial layer 300 covering the shielding electrode 199.

Next, a transparent metallic material such as indium tin oxide (ITO), indium zinc oxide (IZO), or the like is deposited on the sacrificial layer 300 to form a common electrode 270.

Next, a third insulating layer 350 may he formed on the common electrode 270 using an inorganic insulating material such as a silicon nitride (SiNx), a silicon oxide (SiOx), a silicon oxynitride (SiOxNy), etc.

Next, an organic material is coated on the third insulating layer 350 and is then patterned to form a roof layer 360.

In this case, the patterning may he performed to remove the organic material that is positioned in the first valley V1.

Thus, the roof layer 360 is formed to he connected along a plurality of pixel rows.

Figure 14:
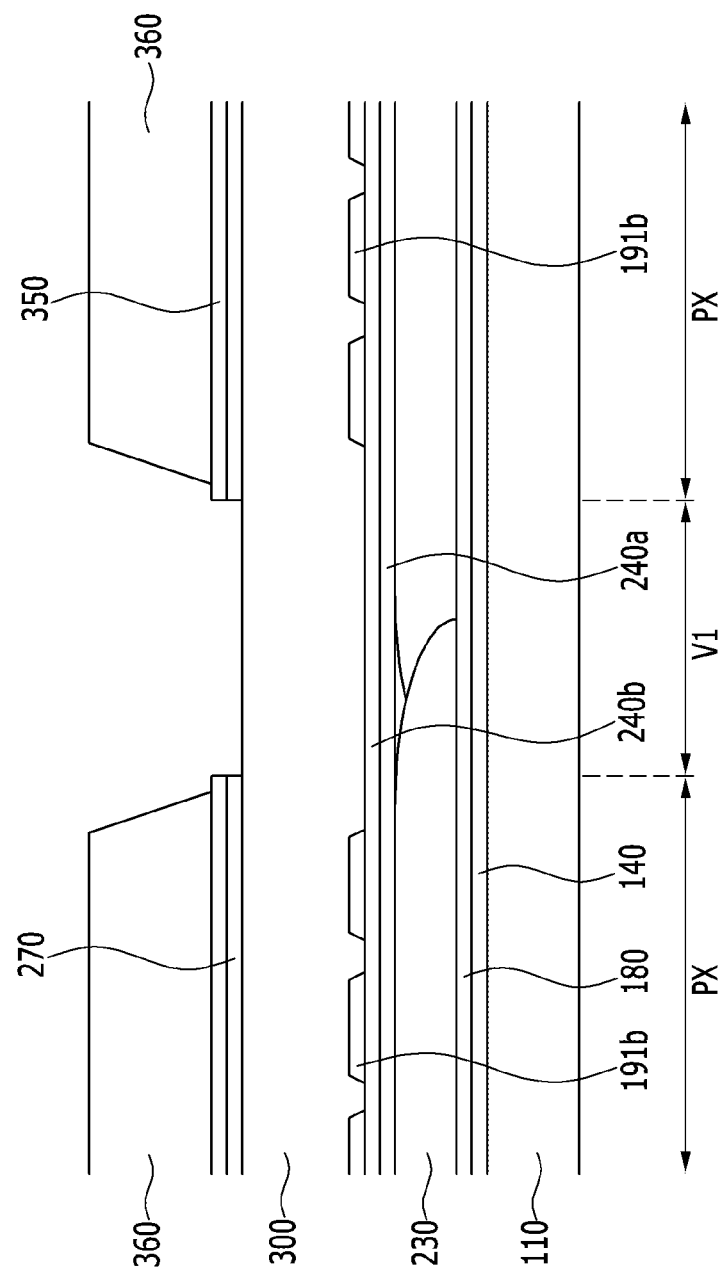
Figure 15:
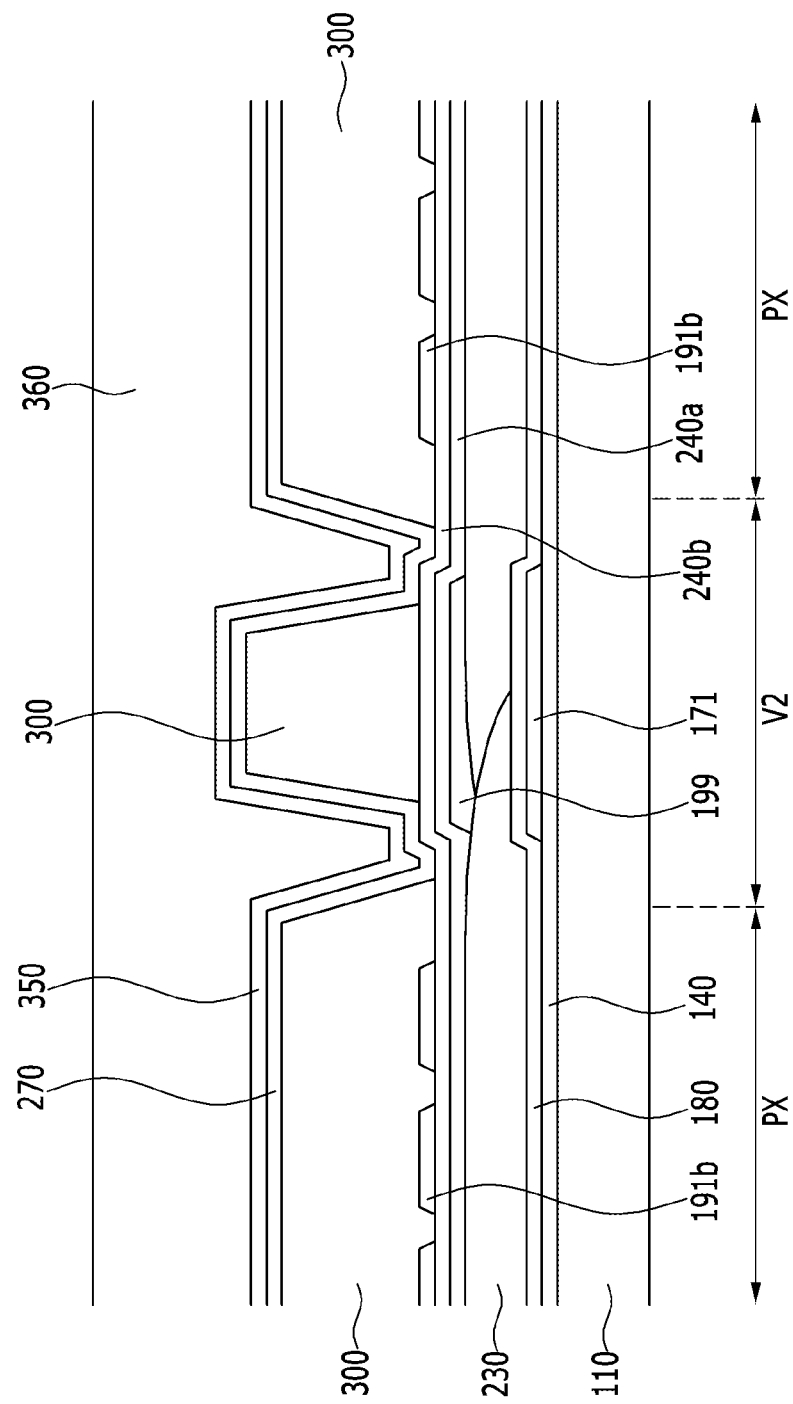

Next, as shown in FIGS. 14 and 15, the third insulating layer 350 and the common electrode 270 are patterned using the roof layer 360 as a mask.

The third insulating layer 350 is dry-etched using the roof layer 360 as the mask and then the common electrode 270 is wet-etched.

Figure 16:
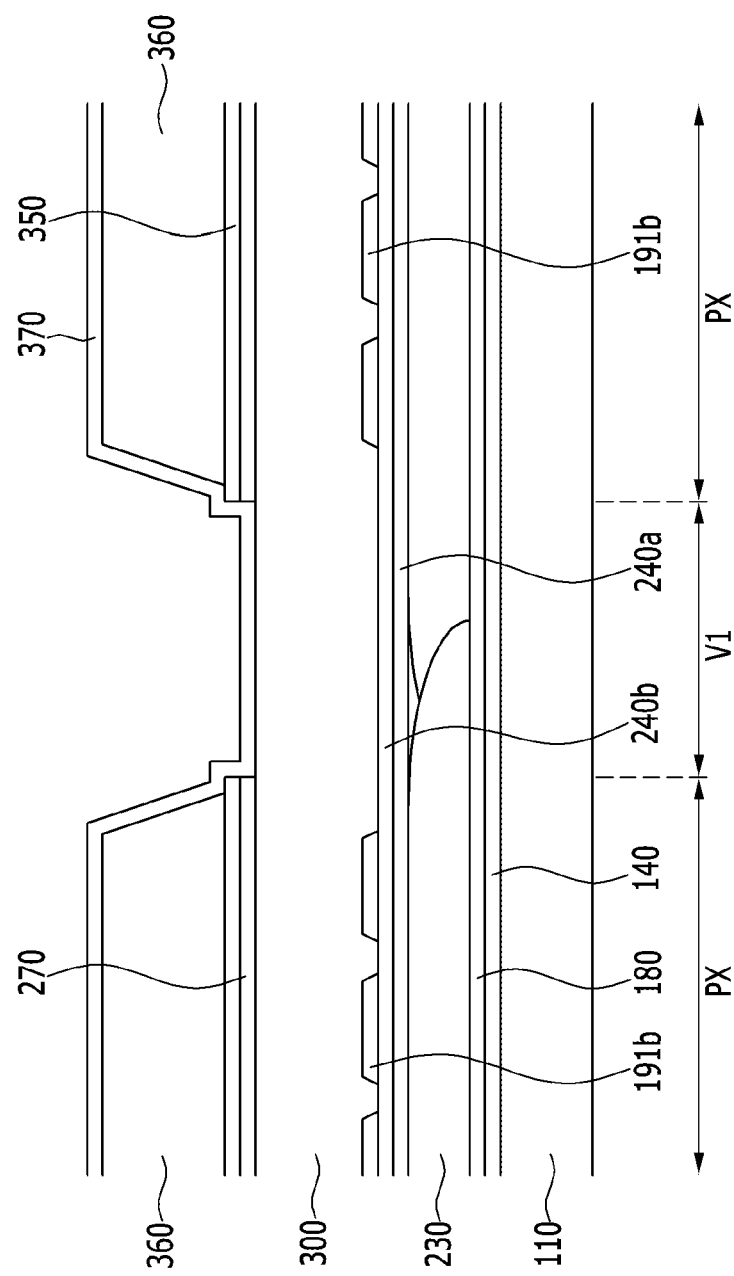
Figure 17:
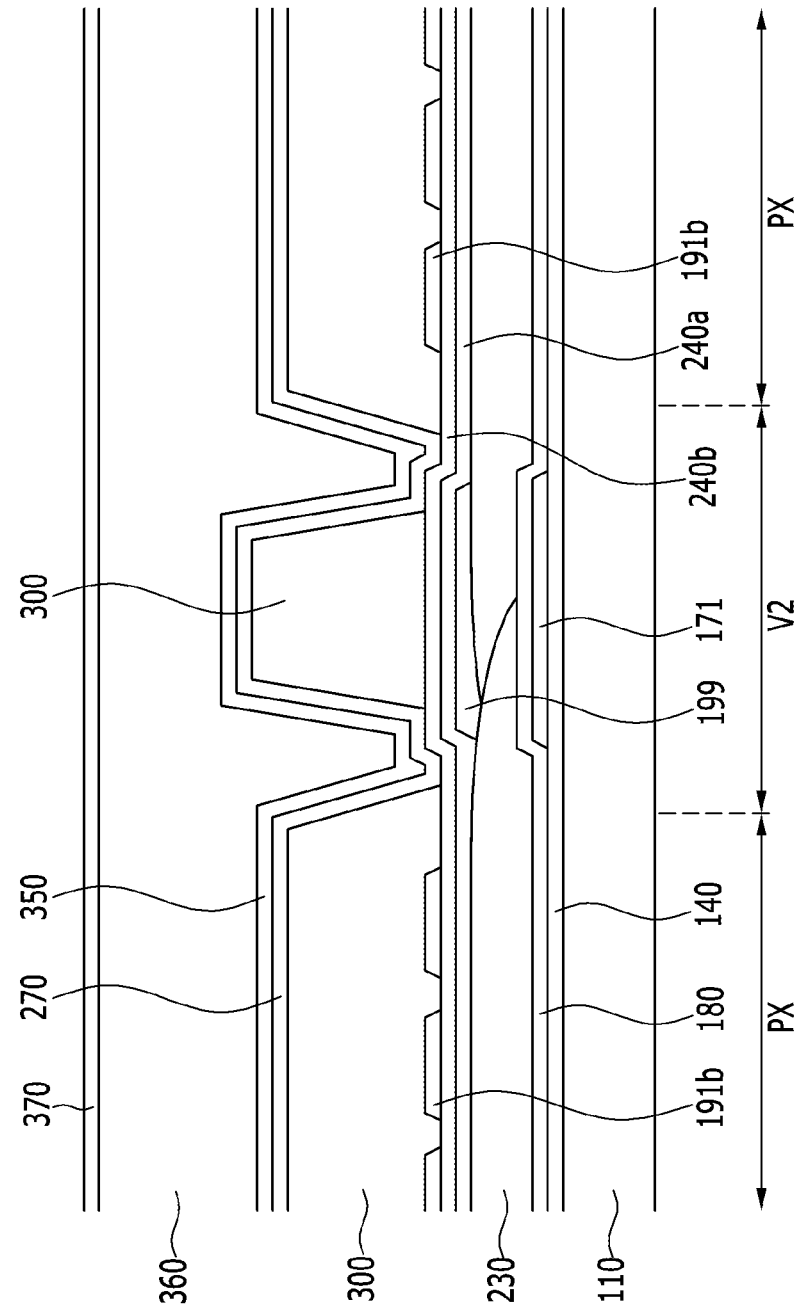

Next, as shown in FIGS. 16 and 17, a fourth insulating layer 370 may be formed using an inorganic insulating material such as a silicon nitride (SiNx), a silicon oxide (SiOx), a silicon oxynitride (SiOxNy), etc.

Figure 18:
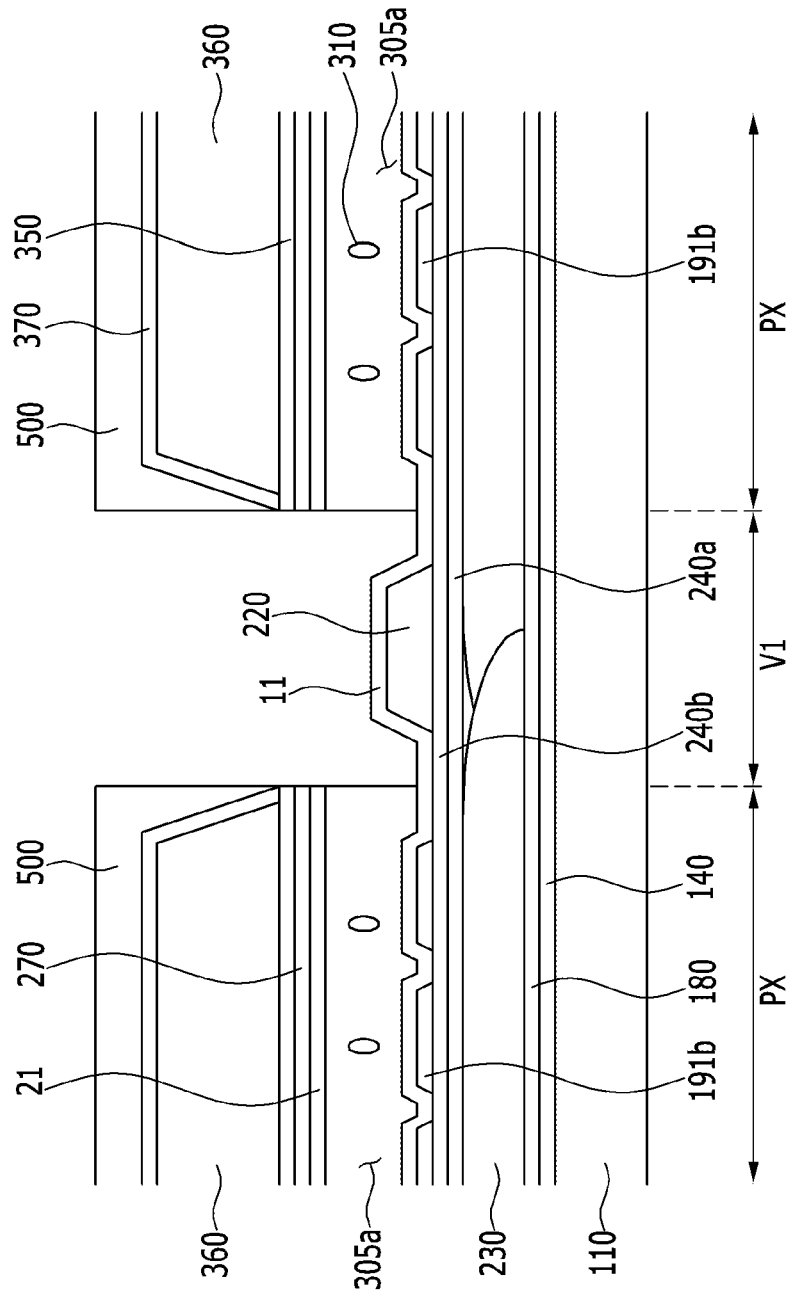
Figure 19:
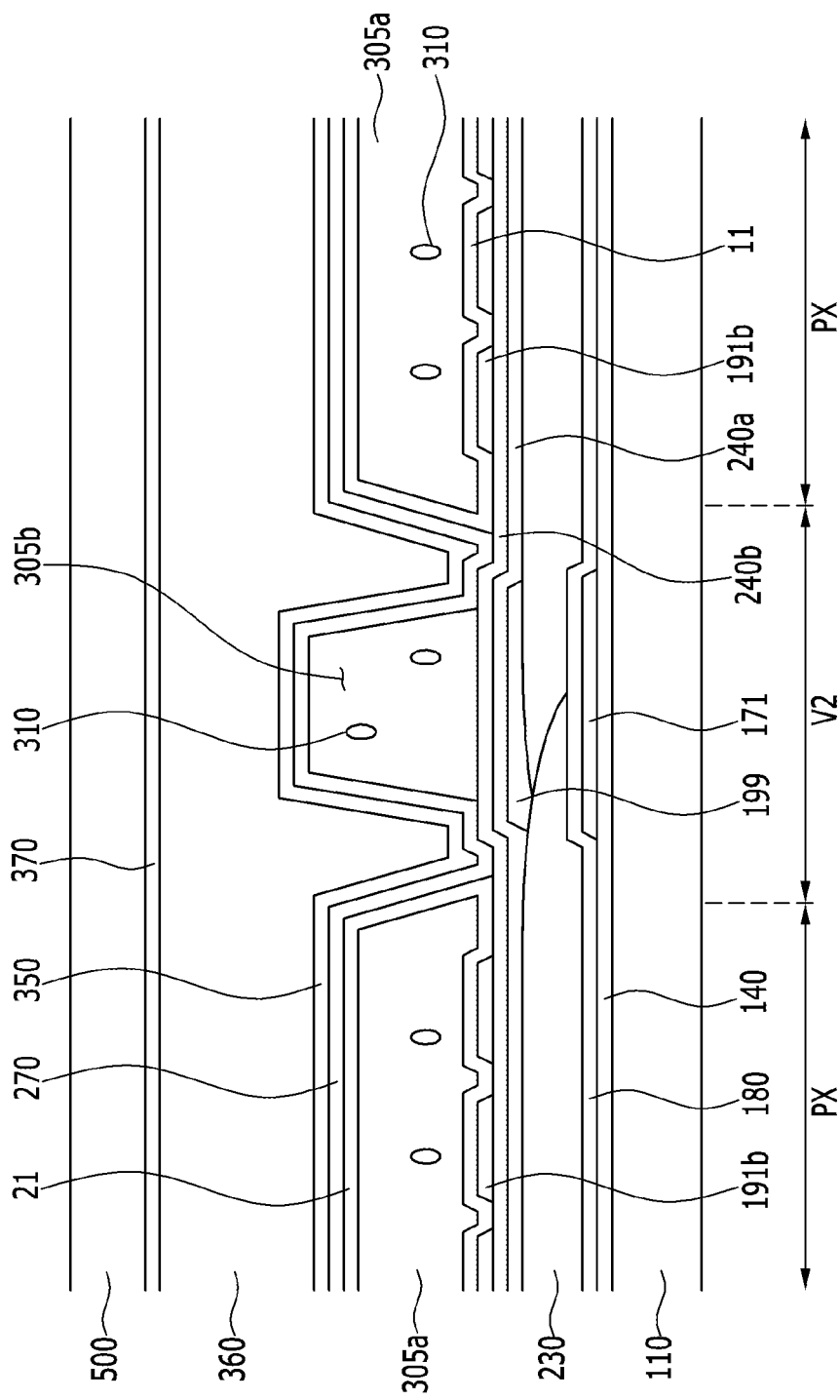

Next, as shown in FIGS. 18 and 19, a photoresist 500 is applied on the fourth insulating layer 370, and a photolithography process is performed to pattern the photoresist 500.

In this case, the photoresist 500 positioned in the first valley V1 may he removed.

The fourth insulating layer 370 is etched using the patterned photoresist 500 as a mask.

That is, the fourth insulating layer 370 positioned in the first valley V1 is removed.

The fourth insulating layer 370 is formed to cover top and lateral surfaces of the roof layer 360 such that it protects the roof layer 360.

A pattern of the third insulating layer 350 may be formed, e.g., by etching using the patterned photoresist 500 and/or the patterned fourth insulating layer 370, such that it is identical or similar to that of the fourth insulating layer 370.

A process for forming the fourth insulating layer 370 has been described, but the embodiments are not limited thereto and the fourth insulating layer 370 may not be formed.

As shown in FIG. 18, the sacrificial layer 300 is completely removed by supplying a developer and a stripper solution on the substrate 110 where the sacrificial layer 300 is exposed, or using an ashing process.

When the sacrificial layer 300 is removed, the microcavities 305a, 305b are created at a position where the sacrificial layer 300 was previously positioned.

According to the exemplary embodiment, a first microcavity 305a and a second microcavity 305b are separately formed.

The pixel electrode 191 and the common electrode 270 are separated from each other while interposing the first microcavity 305a therebetween, and the shielding electrode 199 and the common electrode 270 are separated from each other while interposing the second microcavity 305b therebetween.

The common electrode 270 and the roof layer 360 are formed to cover top and opposite lateral surfaces of the first and second microcavities 305a and 305b.

The microcavities 305a and 305b are exposed outside through portions where the roof layer 360, the third insulation layer 350, and the common electrode 270 are removed, and the portions are respectively referred to as a first injection hole 307a and a second injection hole 307b.

The injection holes 307a and 307b are formed along the first valley V1.

Next, the substrate 110 is heated to harden the roof layer 360.

This is for the first and second microcavities 305a and 305b to retain their shapes by virtue of the roof layer 360.

Next, a light blocking member 220 is formed on a border section of the pixel area PX and on the thin film transistor.

According to the exemplary embodiment, the color filters 230 may overlap each other, and may be formed along the gate line 121.

That is, the light blocking member 220 extending in a horizontal direction is formed.

Next, when an aligning agent containing an alignment material is dripped on the substrate 110 using a spin coating method or an inkjet method, the aligning agent is injected into the first and second microcavities 305a and 305b through the first and second injection holes 307a and 307b.

When the aligning agent is injected into the microcavities 305a and 305b and then a hardening process is performed, a solution component is evaporated and the alignment material remains at inner wall surfaces of the microcavities 305a and 305b.

Accordingly, a first alignment layer 11 may be formed on the pixel electrode 191, and a second alignment layer 21 may be formed under the common electrode 270.

The first and second alignment layers 11 and 21 are formed to face each other while interposing the microcavities 305a and 305b therebetween, and are coupled to each other at edges of the pixel areas PX.

In this case, the first and second alignment layers 11 and 21 may be aligned in a direction perpendicular to the substrate 110, except at the lateral surfaces of the microcavities 305a and 305b.

In addition, a process of irradiating ultraviolet rays to the first and second alignment layers 11 and 21 may be performed such that the alignment layers 11 and 21 are aligned in a direction parallel to the substrate 110.

Next, when a liquid crystal material consisting of liquid crystal molecules 310 is dripped on the substrate 110 using an inkjet method or a dispensing method, the liquid crystal material is injected into the microcavities 305a and 305b through the injection holes 307a and 307b.

In this case, the liquid crystal material may be dripped in the injection holes 307a and 307b that are formed along the odd-numbered first valleys V1, and may not be dripped in the injection holes 307a and 307b that are formed along the even-numbered first valleys V1.

On the contrary, the liquid crystal material may be dripped in the injection holes 307a and 307b that are formed along the even-numbered first valleys V1, and may not be dripped in the injection holes 307a and 307b formed along the odd-numbered first valleys V1.

When the liquid crystal material is dripped in the injection holes 307a and 307b that are formed along the odd-numbered first valleys V1, the liquid crystal material passes through the injection holes 307a and 307b by capillary force such that it enters into the microcavities 305a and 305b.

In this case, since air inside the microcavities 305a and 305b is discharged through the injection holes 307a and 307b that are formed along the even-numbered first valleys V1, the liquid crystal material enters into the microcavities 305a and 305b.

Further, the liquid crystal material may be dripped in all of the injection holes 307a and 307b.

That is, the liquid crystal material may be dripped in both the injection hole 307a and the injection hole 307b that are respectively formed along the odd-numbered and even-numbered first valleys V1.

As described above, when the liquid crystal material is injected into the microcavities 305a, 305b by capillary force, the liquid crystals dripped into the microcavities 305a, 305b may partially contact the roof layer 360 and thus remain on the roof layer 360.

Next, as shown in FIGS. 3 and 4, an overcoat 390 is formed by depositing a material that does not react with the liquid crystal molecules 310 on the fourth insulating layer 370.

The overcoat 390 is formed to cover the injection holes 307a and 307b through which the microcavities 305a and 305b are exposed outside, thereby sealing the microcavities 305a and 305b.

Next, though not illustrated, polarizers may be attached to top and bottom surfaces of the display device.

The polarizers may include a first polarizer and a second polarizer.

The first polarizer may be attached to a bottom surface of the substrate 110, and the second polarizer may be attached on the overcoat 390.

According to the exemplary embodiment, light leakage may be controlled by the shielding electrode 199 rather than by the light blocking member 220 that is formed along the data line 171.

In addition, by forming a horizontal light blocking member 220 that is formed after the sacrificial layer 300 is removed, light leakage occurring in the thin film transistor region may be eliminated and a simplified manufacturing process may be possible.

In addition, visibility can be improved by splitting the pixel area into three regions R1, R2, R3 where voltage differences between the common electrode 270 and the pixel electrode 191 are different.

A liquid crystal display according to another exemplary embodiment will now be described with reference to FIGS. 20 to 22.

Figure 20:
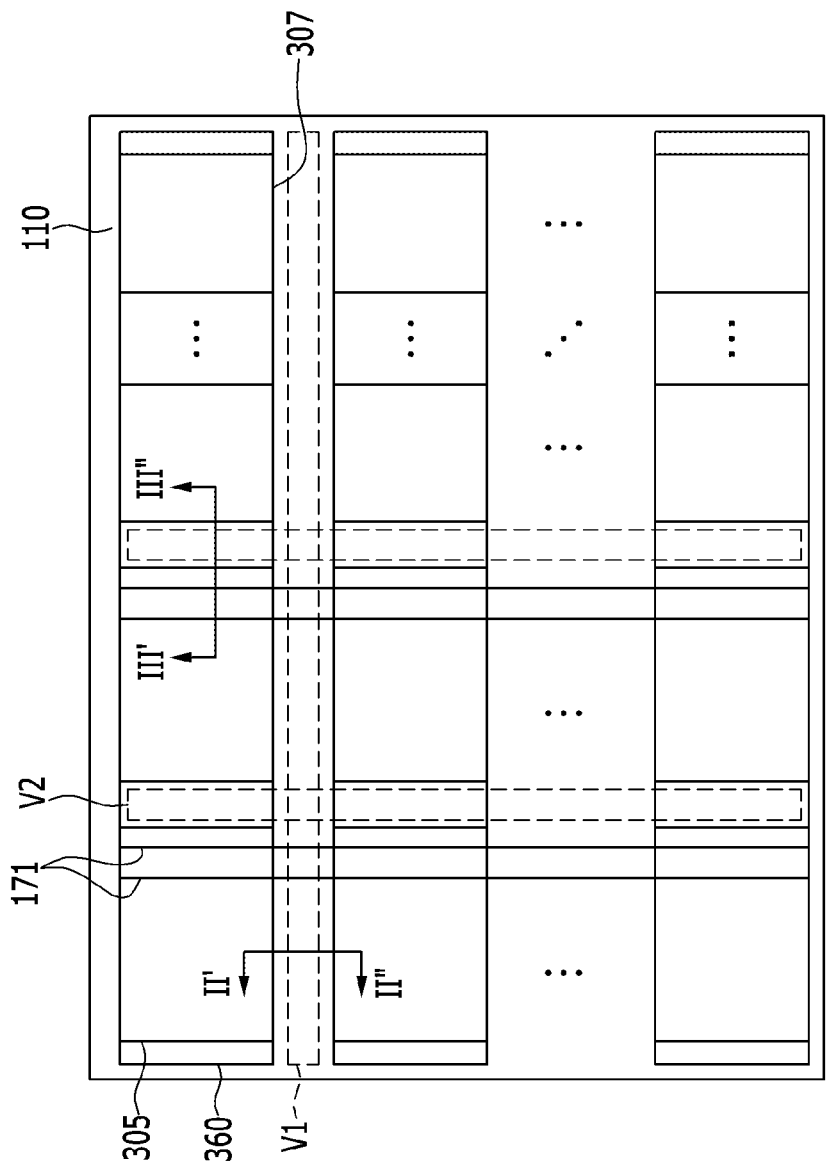
FIG. 20 is a top plan view of a display device according to another exemplary embodiment.
Figure 21:
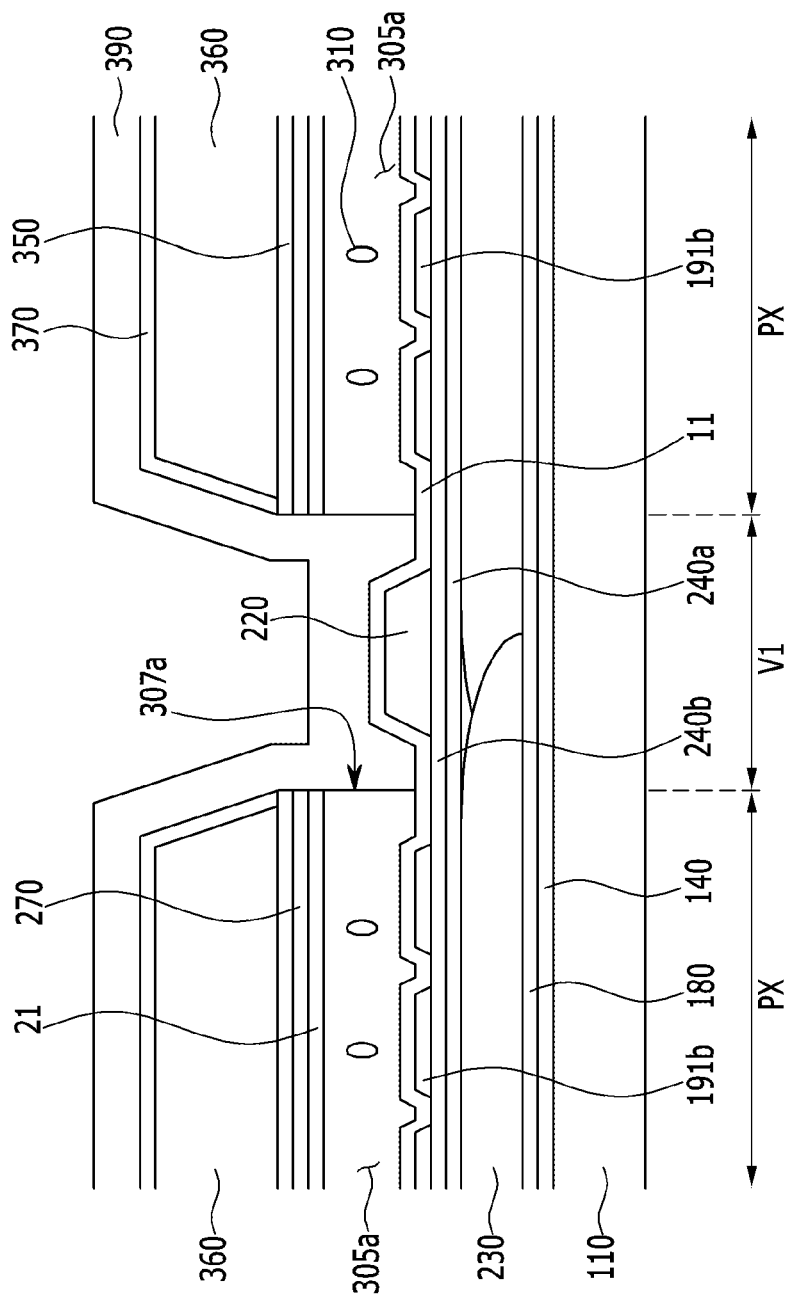
FIG. 21 is a cross-sectional view of FIG. 20 taken along the line II'-II".
Figure 22:
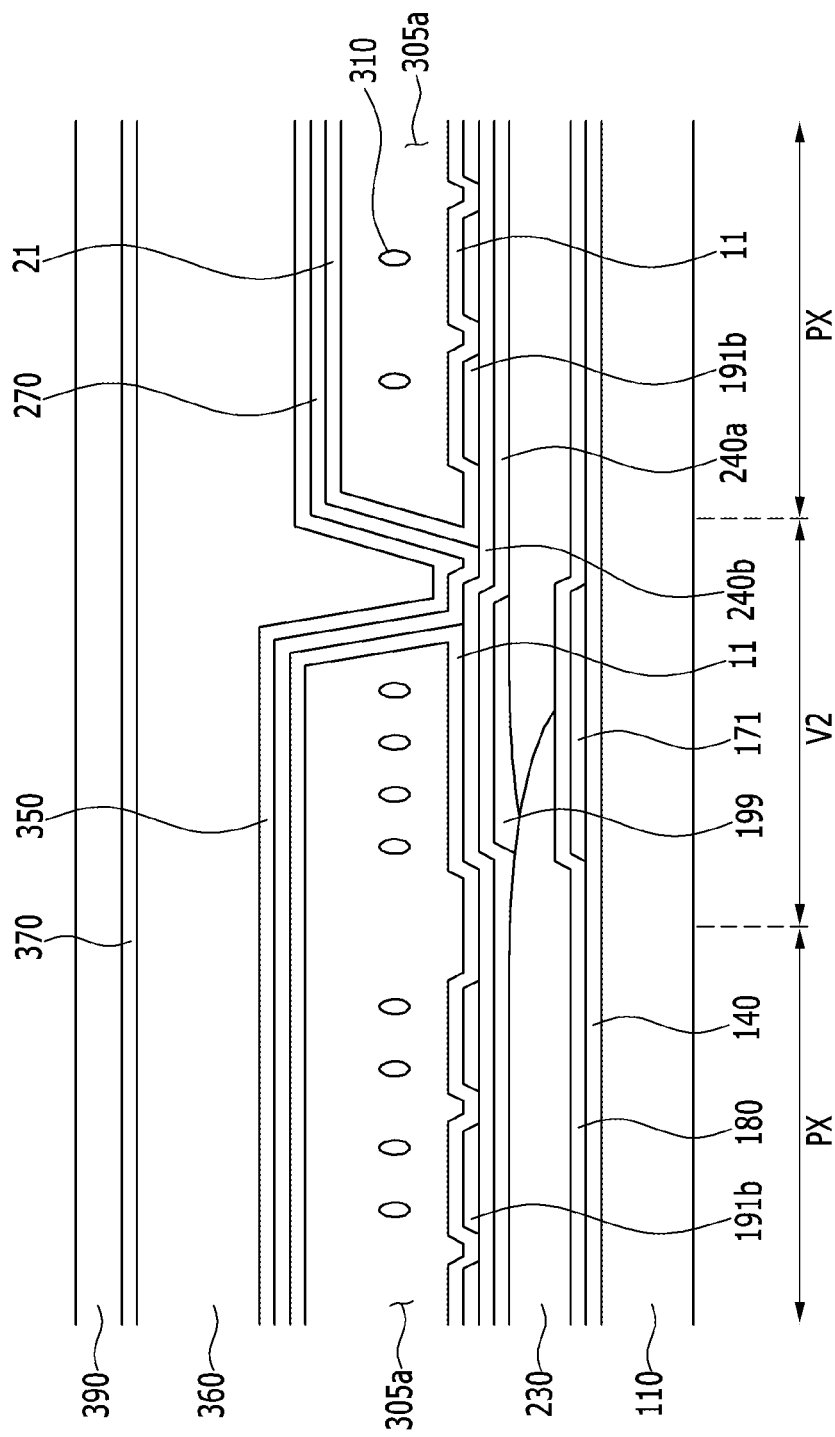
FIG. 22 is a cross-sectional view of FIG. 20 taken along the line III'-III".

FIG. 20 is a top plan view of a display device according to another exemplary embodiment, FIG. 21 is a cross-sectional view of FIG. 20 taken along the line II'-II", and FIG. 22 is a cross-sectional view of FIG. 20 taken along the line III'-III".

For convenience, some constituent elements are illustrated in FIG. 20, and constituent elements that are identical or similar to those of previous exemplary embodiments will be omitted.

A display device according to an exemplary embodiment includes a substrate 110 that is formed of a material such as glass or plastic, and a roof layer 360 formed on the substrate 110.

The substrate 110 includes a plurality of pixel areas PX.

The plurality of pixel areas PX are arranged in a matrix form that includes a plurality of pixel rows and a plurality of pixel columns.

A first valley V1 is positioned along a row direction of the pixel area between the plurality of pixel areas PX, and a second valley V2 is positioned between a plurality of pixel columns.

The roof layer 360 is formed along a direction of the pixel row.

In this case, an injection hole 307 is formed in the first valley V1 such that the roof layer 360 is removed to expose the constituent element positioned under the roof layer 360.

Each roof layer 360 is formed to be separated from the substrate 110 between the adjacent second valleys V2, thereby forming a microcavity 305, e.g., which includes the microcavity 305a.

Further, each roof layer 360 is formed to be attached on the substrate 110 in the second valley V2 such that it covers opposite lateral surfaces of the microcavity 305.

According to the exemplary embodiment, while being enclosed by the first and second valleys V1 and V2, the microcavity 305 where a pixel electrode is positioned is injected with a liquid crystal material through the injection hole 307, and particularly, is formed to include a data line 171.

That is, the data line 171 is positioned in a region that is formed by the microcavity 305.

The aforementioned structure of the display device according to the exemplary embodiment is exemplarily provided and thus numerous variations thereof may be possible.

As an example, arrangement of the pixel areas PX, the first valley V1, and the second valley V2 may be changed, the plurality of roof layers 360 may be coupled to each other in the first valley V1, and each roof layer 360 may be partially formed to be separated from the substrate 110 in the second valley V2 such that the adjacent microcavities 305 are coupled to each other.

Next, referring to FIG. 21, a region where the first valley V1 is positioned is almost the same as that in the exemplary embodiment.

A lamination structure for the exemplary embodiment is almost identical to that for another exemplary embodiment.

However, according to the other exemplary embodiment, a second microcavity is not present and thus one microcavity 305a is positioned in one pixel area.

That is, the microcavities 305a according to the exemplary embodiment are positioned between the data lines 171 that are positioned along the edge of one pixel area.

However, the microcavity 305a according to another exemplary embodiment is formed to include either one of the data lines 171 while including one pixel area.

As shown in FIG. 22, the microcavity 305a is formed to overlap the data line 171 that is positioned at the right side of the pixel area.

In the present specification, the microcavity 305a is illustrated and described to overlap the data line 171 that is positioned at the right side, but it is not limited thereto and may overlap either one of the data lines 171.

As such, according to the exemplary embodiment in which the microcavity 305a overlaps the data line 171, the shielding electrode 199 overlapping the data line 171 also overlaps the microcavity 305a.

The shielding electrode 199 is positioned on the data line 171, and may have a shape that is identical or similar to a planar shape of the microcavity 305, particularly, the data line 171.

The shielding electrode 199 is positioned at opposite sides of one pixel area along edge thereof above the data lines 171.

The shielding electrode 199 may not be separately positioned in each pixel area but may be formed as a continuum across all of the adjacent pixels.

Since the shielding electrode 199 is applied with the same voltage as the common electrode 270, no electric field is generated between the shielding electrode 199 and the common electrode 270 and thus the liquid crystal molecules between the shielding electrode 199 and the common electrode 270 are not aligned.

Thus, the liquid crystals positioned therebetween are in a black state and thus may serve as a light blocking member.

Accordingly, according to the other exemplary embodiment, even in the same microcavity 305a, the liquid crystal molecules 310 positioned between the shielding electrode 199 and the common electrode 270 serve as the light blocking member, and the liquid crystal molecules positioned between the pixel electrode 191 and the common electrode 270 are aligned by the electric field.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

<Description of Symbols>

| | |
|---|---|
| 11: first alignment layer | 21: second alignment layer |
| 110: substrate | 121: gate line |
| 124a: first gate electrode | 124b: second gate electrode |
| 124c: third gate electrode | 131: reference voltage line |
| 140: gate insulating layer | 154a: first semiconductor |
| 154b: second semiconductor | 154c: third semiconductor |
| 171: data line | 173a: first source electrode |
| 173b: second source electrode | 173c: third source electrode |
| 175a: first drain electrode | 175b: second drain electrode |
| 175c: third drain electrode | 180: passivation layer |
| 191: pixel electrode | 191a: first subpixel electrode |
| 191b: second subpixel electrode | 220: light blocking member |
| 230: color filter | 240a: first insulating layer |
| 270: common electrode | 300: sacrificial layer |
| 305: microcavity | 307: injection hole |
| 310: liquid crystal molecules | |

What is claimed is:

1. A liquid crystal display (LCD) comprising:
an insulation substrate including a plurality of pixel areas;
a thin film transistor including gate and data lines positioned on the insulation substrate and that are insulated from and cross each other;
a passivation layer positioned on the thin film transistor;
a pixel electrode positioned on the passivation layer and including a first subpixel electrode to which a first voltage is configured to be applied and a second subpixel electrode to which a second voltage is configured to be applied;
a shielding electrode positioned on the passivation layer and configured to be applied with a common voltage;
a first microcavity positioned on the pixel electrode and injected with a liquid crystal material;
a second microcavity positioned on the shielding electrode and injected with the liquid crystal material;
a common electrode positioned on the first and second microcavities and separated from the pixel electrode and the shielding electrode by the first and second microcavities;
a roof layer positioned on the common electrode;

a first injection hole and a second injection hole in the common electrode and the roof layer to extend to the first and second microcavities; and an overcoat positioned on the roof layer and covering the first and second injection holes to seal the first and second microcavities.

2. The LCD of claim 1, wherein the shielding electrode overlaps the data line.

3. The LCD of claim 2, further comprising:
a color filter positioned on the passivation layer;
a first insulating layer positioned on the color filter;
a second insulating layer positioned between the first and second subpixel electrodes; and
a third insulating layer positioned on the common electrode.

4. The LCD of claim 3, further comprising a light blocking member positioned on the second insulating layer along a direction of the gate line.

5. The LCD of claim 3, wherein at least a part of the first suhpixel electrode is positioned under the second insulating layer, an other part of the first suhpixel electrode is positioned on the second insulating layer, and the second suhpixel electrode is positioned over the second insulating layer.

6. The LCD of claim 5, wherein the first suhpixel electrode includes a first subregion positioned under the second insulating layer and a second subregion positioned over the second insulating layer, and the first subregion and the second subregion are coupled to each other through a contact hole that is in the second insulating layer.

7. The LCD of claim 6, wherein the second subpixel electrode includes a plurality of branch electrodes that extend along respective different directions.

8. The LCD of claim 7, wherein one pixel area includes: a first region where the second subregion of the first suhpixel electrode is positioned; a second region where the first subregion of the first subpixel electrode and a part of the second suhpixel electrode overlap each other; and a third region where an other part of the second suhpixel electrode is positioned.

9. The LCD of claim 8, wherein a difference between the first voltage and the common voltage is greater than a difference between the second voltage and the common voltage.

10. A liquid crystal display (LCD) including:
an insulation substrate including a plurality of pixel areas;
a thin film transistor including gate and data lines positioned on the insulation substrate and that are insulated from and cross each other;
a passivation layer positioned on the thin film transistor;
a pixel electrode positioned on the passivation layer and including a first suhpixel electrode to which a first voltage is configured to he applied and a second suhpixel electrode to which a second voltage is configured to he applied;

a shielding electrode positioned on the passivation layer and configured to be applied with a common voltage;
a microcavity positioned on the pixel and shielding electrodes and injected with a liquid crystal material to form a liquid crystal layer;
a common electrode positioned on the microcavity and separated from the pixel electrode by the liquid crystal layer;
a roof layer positioned on the common electrode;
an injection hole in the common electrode and the roof layer to extend to the microcavity; and
an overcoat positioned on the roof layer and covering the injection hole to seal the microcavity, wherein the microcavity overlaps the shielding electrode and the pixel electrode.

11. The LCD of claim 10, further including:
a color filter positioned on the passivation layer;
a first insulating layer positioned on the color filter;
a second insulating layer positioned between the first and second suhpixel electrodes; and
a third insulating layer positioned on the common electrode.

12. The LCD of claim 11, wherein the shielding electrode further includes a light blocking member overlapping the data line, positioned on the second insulating layer, and disposed along a direction of the gate line.

13. The LCD of claim 10, wherein at least a part of the first suhpixel electrode is positioned under the second insulating layer, and the second suhpixel electrode is positioned over the second insulating layer.

14. The LCD of claim 13, wherein the first subpixel electrode includes a first subregion positioned under the second insulating layer and a second subregion positioned over the second insulating layer, and the first and second subregions are coupled to each other through a contact hole in the second insulating layer.

15. The LCD of claim 14, wherein the second subpixel electrode includes a plurality of branch electrodes that extend along respective different directions.

16. The LCD of claim 15, wherein one pixel area includes:
a first region where the second subregion of the first subpixel electrode is positioned;
a second region where the first subregion of the first subpixel electrode and a part of the second subpixel electrode overlap each other; and
a third region where an other part of the second subpixel electrode is positioned, wherein
a difference between the first voltage and the common voltage is greater than a difference between the second voltage and the common voltage.

* * * * *